(12) United States Patent
Augustyniak et al.

(10) Patent No.: US 10,553,465 B2
(45) Date of Patent: Feb. 4, 2020

(54) CONTROL OF WATER BOW IN MULTIPLE STATIONS

(71) Applicant: Lam Research Corporation, Fremont, CA (US)

(72) Inventors: Edward Augustyniak, Tualatin, OR (US); David French, Lake Oswego, OR (US); Sunil Kapoor, Vancouver, WA (US); Yukinori Sakiyama, West Linn, OR (US); George Thomas, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 126 days.

(21) Appl. No.: 15/640,053

(22) Filed: Jun. 30, 2017

(65) Prior Publication Data

US 2018/0025930 A1 Jan. 25, 2018

Related U.S. Application Data

(60) Provisional application No. 62/366,515, filed on Jul. 25, 2016.

(51) Int. Cl.
| | | |
|---|---|---|
| *H01J 37/32* | (2006.01) | |
| *H01L 21/67* | (2006.01) | |
| *H01L 21/687* | (2006.01) | |

(52) U.S. Cl.
CPC .. *H01L 21/67288* (2013.01); *H01J 37/32183* (2013.01); *H01J 37/32385* (2013.01); *H01J 37/32577* (2013.01); *H01J 37/32715* (2013.01); *H01J 37/32935* (2013.01); *H01L 21/67069* (2013.01); *H01L 21/67167* (2013.01); *H01L 21/67201* (2013.01); *H01L 21/67207* (2013.01); *H01L 21/67253* (2013.01); *H01L 21/67259* (2013.01); *H01L 21/68771* (2013.01); *H01J 2237/3321* (2013.01)

(58) Field of Classification Search
None
See application file for complete search history.

(56) References Cited

U.S. PATENT DOCUMENTS

| | | | | |
|---|---|---|---|---|
| 2012/0074844 | A1* | 3/2012 | York | H03H 7/40 315/111.21 |
| 2012/0164834 | A1* | 6/2012 | Jennings | H01J 37/32082 438/694 |
| 2014/0214395 | A1* | 7/2014 | Valcore, Jr. | G06F 17/5063 703/14 |

\* cited by examiner

*Primary Examiner* — Zandra V Smith
*Assistant Examiner* — Lawrence C Tynes, Jr.
(74) *Attorney, Agent, or Firm* — Penilla IP, APC

(57) ABSTRACT

A system for controlling of wafer bow in plasma processing stations is described. The system includes a circuit that provides a low frequency RF signal and another circuit that provides a high frequency RF signal. The system includes an output circuit and the stations. The output circuit combines the low frequency RF signal and the high frequency RF signal to generate a plurality of combined RF signals for the stations. Amount of low frequency power delivered to one of the stations depends on wafer bow, such as non-flatness of a wafer. A bowed wafer decreases low frequency power delivered to the station in a multi-station chamber with a common RF source. A shunt inductor is coupled in parallel to each of the stations to increase an amount of current to the station with a bowed wafer. Hence, station power becomes less sensitive to wafer bow to minimize wafer bowing.

16 Claims, 15 Drawing Sheets

FIG. 6 (Sensor control)

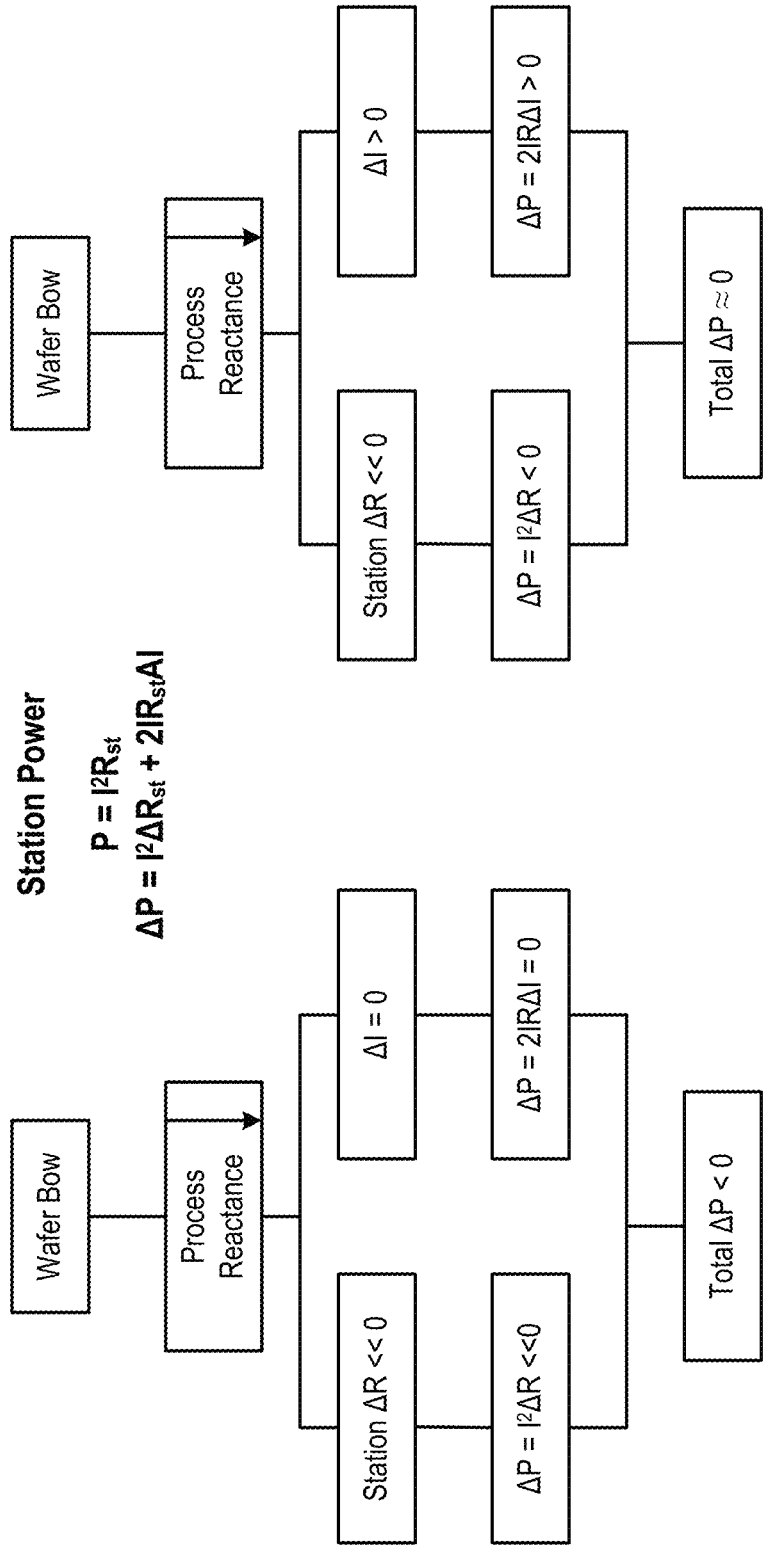

CONTROL OF WAFER BOW IN MULTIPLE STATIONS

CLAIM OF PRIORITY

The present patent application claims the benefit of and priority, under 35 U.S.C. § 119(e), to U.S. Provisional Patent Application No. 62/366,515, filed on Jul. 25, 2016, and titled "Stabilization of RF Power in Multiple Stations", which is incorporated by reference herein in its entirety.

FIELD

The present embodiments relate to systems and methods for controlling wafer bow in multiple plasma processing stations and for stabilization of RF power in multiple stations.

BACKGROUND

Generally, process reactors are used to process operations upon wafers, e.g., silicon wafers. These wafers are typically processed numerous times in various reactors in order to form integrated circuits thereon. Some of these process operations involve, for instance, depositing materials over select surfaces or layers of a wafer. One such reactor is a plasma enhanced chemical vapor deposition (PECVD) reactor.

For example, a PECVD reactor may be used to deposit insulation films such as silicon oxide (SiO), silicon nitride (SiN), silicon carbide (SiC), silicon oxycarbide (SiOC), and others. Such material films may include an aluminum (Al) alloy. Depending on the type of film being deposited, specific reaction gases are brought into the PECVD reactor while radio frequency (RF) power is supplied to produce plasma that enables the deposition. The RF power is generated by an RF generator and provided via a matchbox to an electrode of the PECVD reactor.

Furthermore, in the PECVD reactor, with an increase in a number of layers deposited on the wafer, there is an increase in bow of the wafer at its edges. The wafer bow creates a capacitance that impedes an application of power to the wafer.

It is in this context that embodiments described in the present disclosure arise.

SUMMARY

Embodiments of the disclosure provide systems and methods for controlling wafer bow in multiple plasma processing stations. It should be appreciated that the present embodiments can be implemented in numerous ways, e.g., a process, an apparatus, a system, a device, or a method on a computer-readable medium. Several embodiments are described below.

In various embodiments, systems and methods to split multiple non 50 ohm source signals to multiple substrate stations sharing a vacuum environment with selectivity to divert power to specific ones of the substrate stations and ignite, enable, or control plasma on specific one of the substrate stations are provided. This includes plasma processing of specific ones of the substrate stations pre-selected and radio frequency (RF) in-situ balancing for station to station substrate process variability control using active tunable elements in a capacitive coupled plasma system environment.

In some embodiments, coaxial and non coaxial type outputs are provided to the substrate stations with various impedance range and various power levels.

In various embodiments, a combiner and distributor for multiple frequencies with adequate tuning range to accommodate a variety of impedance transformations in the substrate stations during a multi-step process is provided. The combiner and distributor receives multiple non 50 ohm power signals with various impedance ranges and various power levels as inputs from active tuning matching networks outputs. Moreover, switches, e.g., vacuum relay based switches, etc., in the combiner and distributor divert power to dummy impedances for the substrate stations not needing power. The combiner and distributor introduce signals of the multiple frequencies to each of the substrate stations. Also, the combiner and distributor varies the signals of the multiple frequencies to each of the substrate stations. The combiner and distributor includes filters, e.g., direct current (DC) blocking capacitors, inductors, etc., for isolation of the frequencies from each other and minimizing feedback to inputs of the combiner and distributor.

In some embodiments, the combiner and distributor includes a balancing inductor at each of its outputs to manage plasma sheath capacitance change with RF power and also controlling resonant frequency shift during plasma ignition and other process recipe transitions.

In various embodiments, an automated control, e.g., a probe control and system control, etc., is provided to vary positions of tuning elements, e.g., capacitors, etc., of the combiner and distributor for each of the substrate stations during active RF processes to provide impedance transformation.

In some embodiments, a method to move and control variable capacitors, e.g., vacuum capacitors, etc., during a plasma process to enable running multi layer process with varying impedance transformations is provided. The automated control of active change in the tuning elements helps active compensation by controlling RF signal amplitude and phase.

In various embodiments, the combiner and distributor is remotely mounted and outputs of the combiner and distributor are coaxed to electrode inputs of the substrate stations.

In several embodiments, a parameter probe, e.g., a complex voltage and current probe, etc., is connected to each of the substrate stations to monitor and provide feedback to the probe control and system control. The probe control and system control uses a mechanism to run closed loop system for power control.

In some embodiments, the combiner and distributor allows to process multi-layer processes without turning off RF power.

In various embodiments, the combiner and distributor allows active change of RF signal levels to each of the substrate stations to improve station to station matching or desired process results in each of the substrate stations.

In several embodiments, the automated control of change in the tuning elements helps active compensation by controlling RF signal amplitude and phase.

In some embodiments, a multi-station reactor, e.g., a capacitively coupled discharges (CCP) reactor, etc., uses a single RF source (per frequency). RF power is split among multiple stations with a power distribution circuit. The power distribution circuit is built from passive electrical components, e.g., capacitors and inductors, etc. Balanced power split is achieved when each of stations powered from the same RF source gets $1/N^{th}$ of the total available power.

Vertically Integrated Memory (VIM) technology deposits tens of oxide and nitride (or oxide and polysilicon) layers on a silicon substrate. To illustrate, CCP reactors are used to deposit multilayer films. Individual layers are as thin as couple of hundred Angstroms but the combined thickness of a stack of such layers exceeds several microns. For example, a number of layers in a deposition stack sometimes exceed one hundred and result in a total thickness of an order of a few microns. The stack deposition happens on a single station by interleaving oxide chemistry with nitride chemistry, or oxide and polysilicon. Thin films are characterized by their intrinsic stress. When an effective stress of the stack is not close to neutral, e.g., zero, a strain is exerted by the layers on the silicon substrate. The strain exerted on the silicon substrate changes wafer shape resulting in bowed wafers. For example, a surface of the silicon substrate changes from being flat to being curved. A definition of a bowed wafer depends on process sensitivity to substrate flatness but in general it indicates a wafer with a bow, e.g., deviation from flatness, etc., exceeding a pre-determined threshold value. Bowed wafers that are concave when placed on a support have positive bow and their film stress is called tensile. Bowed wafers that are convex when placed on a support have negative bow and their film stress is called compressive. High wafer bow is undesired because performance of many processing operations depends on surface flatness. The wafer bow negatively impedance of discharge that is used to deposit the films.

The bow is a function of film stress and film thickness which in turn depend on many process parameters. A factor affecting film stress is a flux of energetic ions bombarding film surface during plasma processing. High flux of energetic ions tends to densify film and make it compressive. If ion bombardment is weak, e.g., due to lower plasma density, different gas composition, or pressure, etc., film stress is going to be tensile. Most VIM processes are optimized in such a way that the effective film stress at any moment during stack deposition remains approximately neutral, e.g., close to zero, etc., to maintain substrate flatness. Significant deviation from flatness happens due to deviation from ideal process conditions or due to wafers entering a deposition tool, e.g., PECVD chamber, etc., after previous processing steps which have resulted in substrate bow.

In CCP, silicon wafer works as one of the electrodes in the parallel plate reactor. A bowed wafer will create a gap between the actual electrode, e.g., pedestal, substrate holder, etc., and silicon. Such a gap is seen by an RF system as high impedance in series with the plasma impedance. In result, wafer bow limits RF power available to process. In particular, intensity of ion bombardment in dual frequency discharges is sensitive to the gap under the wafer. Dual frequency excitation, e.g., 13.56 MHz combined with 400 kHz, etc., is used for better control of plasma parameters. High frequency (HF), e.g., 13.56 MHz, etc., affects plasma density in that it is used to generate high plasma density and low frequency (LF), e.g., <1 MHz, etc., is used to accelerate ions to wafer surface by increasing ion energy of the ions that bombard the surface of the silicon substrate. The wafer bow depends on film stress, and the film stress depends on energy and flux of the ions that impinge on the films.

LF excitation is sensitive to capacitive impedances as seen from an impedance expression $Z=1/\omega C$. Bowed wafer creates a capacitor under silicon, e.g., of a nanoFarads (nF) range, etc. Additional impedance affects LF power delivery more than HF power. In result, the discharge characteristics are altered due to different HF/LF power ratio.

Positively bowed wafer causes a run away situation, e.g., wafer bow increases LF impedance, less LF power drives the process, film becomes more and more tensile, which in turn increases wafer bow.

Station power is measured with RF sensors, e.g., current and voltage (VI) probes, etc. It is observed that when number of layers exceeds some number, e.g., 50 layers in ON stack, etc., station power starts to drift. On some stations, which are stations with excessively bowed wafers, power is decreasing by P percent, e.g., as high as 10%, etc. On other stations power is increasing due to the fact that all stations are fed from a common source. As such, there is a power split between stations based on an impedance of each station. The impedance of each station depends on wafer bow of a wafer being processed at the station.

In some embodiments, a combiner and distributor, described herein, applies power to the multiple stations that share one or more common RF sources. The combiner and distributor is used to stabilize LF power delivered to the stations. By modification of the combiner and distributor with multiple shunt inductors, power delivery to wafer bow is desensitized.

In various embodiments, a shunt inductor is implemented within the combiner and distributor. With the shunt inductor, LF power stability is achieved. For example, bowed wafer increases equivalent series reactance of a discharge between two CCP electrodes, and a parasitic discharge which runs in parallel with a main process results in a total station impedance having a smaller resistance R. As another example, since powered delivered to a station can be expressed as $P=I^2R$, where I is station current and R is station resistance, a drop in the resistance R results in a drop in the power P. As yet another example, a differentiation of the power equation yields $\Delta P=I^2\Delta R+2IR\Delta I$, where $\Delta P$ is a change in delivered power, $\Delta R$ is a change in resistance, and $\Delta I$ is a change in current. The diminishing resistance R, e.g., negative $\Delta R$, etc., decreases power delivered to a station. This effect is reduced, e.g., canceled, etc., with a rising current, e.g., positive $\Delta I$, etc. The rising current is achieved by controlling inductances of the shunt inductors. The rising current reduces the drop $\Delta P$ in the power P. For example, the drop $\Delta P$ is reduced to be substantially low, such as to be within a pre-determined range from zero or to be at zero. As another example, $\Delta P=0$ when $\Delta I/I=-\Delta R/2R$.

In an embodiment, a system for controlling of wafer bow in multiple stations is described. The system includes a low frequency circuit coupled to a low frequency impedance matching network. The low frequency circuit provides a low frequency RF signal. The system includes a high frequency circuit coupled to a high frequency impedance matching network. The high frequency circuit provides a high frequency RF signal. The high frequency circuit is coupled to the low frequency circuit. The system includes an output circuit coupled to the high frequency circuit and a plurality of plasma processing stations. The output circuit combines the low frequency RF signal and the high frequency RF signal to generate a plurality of combined RF signals to provide to the plasma processing stations. A shunt inductor is coupled in parallel to one of the plasma processing stations to increase an amount of current to the one of the plasma processing stations.

In an embodiment, a system for delivering power to a plurality of plasma processing stations is described. The system includes a first RF generator that generates a first RF signal having a first frequency. The system further includes a second RF generator that generates a second RF signal having a second frequency. The system includes a first matching network coupled to the first RF generator to receive the first RF signal. The first impedance matching network outputs a first modified RF signal upon receiving the first RF signal from the first RF generator. The system also includes a second matching network coupled to the second RF generator to receive the second RF signal. The second matching network outputs a second modified RF signal upon receiving the second RF signal from the second RF generator. The system includes a power distributor coupled to an output of the first matching network and an output of the second matching network. The power distributor combines the first modified RF signal and the second modified RF signal to provide combined RF signals to a plurality of plasma processing stations. The power distributor has multiple outputs coupled to the plasma processing stations. The power distributor includes a low frequency circuit coupled to the first matching network. The low frequency circuit provides a low frequency RF signal. The power distributor further includes a high frequency circuit coupled to the second matching network and to the low frequency circuit. The high frequency circuit provides a high frequency RF signal. The power distributor includes an output circuit coupled to the high frequency circuit and the plurality of plasma processing stations. The output circuit is combines the low frequency RF signal and the high frequency RF signal to generate the combined RF signals to provide to the plasma processing stations. A shunt inductor is coupled in parallel to one of the plasma processing stations to increase an amount of current to the one of the plasma processing stations.

In one embodiment, a method for reducing wafer bow is described. The method includes providing, by a low frequency circuit coupled to a low frequency impedance matching network, a low frequency RF signal. The method further includes providing, by a high frequency circuit coupled to a high frequency impedance matching network, a high frequency RF signal. The method includes combining the low frequency RF signal and the high frequency RF signal to generate a plurality of combined RF signals to provide to a plurality of plasma processing stations. The method includes reducing wafer bow by a shunt inductor of the low frequency circuit. The wafer bow is reduced when the shunt inductor is coupled in parallel to one of the plasma processing stations to increase an amount of current to the one of the plasma processing stations.

Several advantages of the combiner and distributor include turning off plasma processing to one or more of the substrate stations without a need to turn off RF generators that generate RF signals of the multiple frequencies for providing power from the RF signals to the substrate stations. The turning off of the plasma processing is achieved by coupling the RF signals of the multiple frequencies to one or more dummy loads that correspond to one or more of the substrate stations.

Other advantages of the combiner and distributor include controlling the tuning elements to control values of the parameter at the outputs of the combiner and distributor to perform a variety of plasma processes. The tuning elements are controlled based on feedback received from the outputs of the combiner and distributor.

Yet other advantages of the combiner and distributor include blocking DC power, e.g., power associated with wafer DC bias, etc., that is generated by plasma within a plasma chamber.

Further advantages of the combiner and distributor include that in some embodiments, an RF source per frequency drives the plasma processing stations. Moreover, in various embodiments, all the plasma processing stations are driven in phase. Moreover, in some embodiments, high frequency power and low frequency power is turned off or on to the plasma processing stations at the same time to achieving synchronization for turn off or turn on. For example, there is simultaneous ignition of all the plasma processing stations due to current balancing that forces more current to non-ignited stations and thus forces ignition.

Additional advantages of the herein described systems and methods include reducing wafer bow of one or more wafers using one or more shunt inductors in the combiner and distributor. The wafer bow is reduced by controlling inductances of the one or more shunt inductors to increase amounts of current being supplied to one or more stations. The increase in the amounts of current decreases the wafer bow in plasma processes in the one or more of the stations.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIGS. 12A and 12B are diagrams of embodiments of flowcharts to illustrate an effect of use of the shunt inductors on the reduction in power delivered to the processing stations.

DETAILED DESCRIPTION

The following embodiments describe systems and methods for controlling wafer bow in multiple plasma processing stations so that the wafer bow does not increase. It will be apparent that the present embodiments may be practiced without some or all of these specific details. In other instances, well known process operations have not been described in detail in order not to unnecessarily obscure the present embodiments.

Deposition of films is preferably implemented in a plasma enhanced chemical vapor deposition (PECVD) system. The PECVD system may take many different forms. The PECVD system includes one or more plasma chambers or "reactors" (sometimes including multiple stations) that house one or more wafers and are suitable for wafer processing. Each plasma chamber houses one or more wafers for processing. The one or more plasma chambers maintain a wafer in a defined position or positions with or without motion within that position, e.g. rotation, vibration, or other agitation, etc. The wafer undergoing deposition is transferred from one station to another within a chamber during a process. The film deposition occurs entirely at a single station or any fraction of the film is deposited at any number of stations. While in process, each wafer is held in place by a pedestal, e.g., a wafer chuck, etc., and/or other wafer holding apparatus of the plasma chamber.

Figure 1:
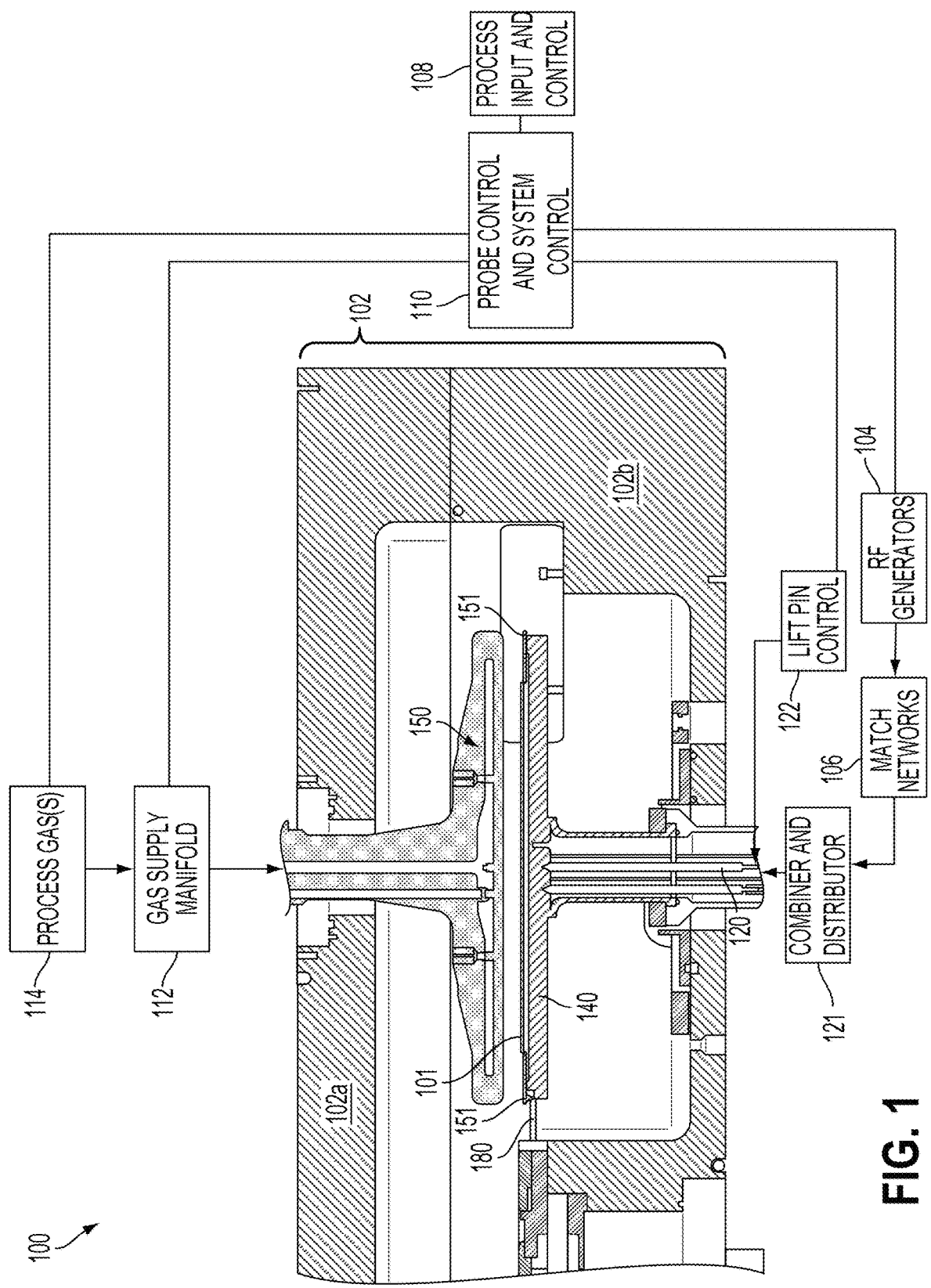
FIG. 1 illustrates a substrate processing system that is used to process a wafer.

FIG. 1 illustrates a substrate processing system 100, which is an example of the PECVD system used to process a wafer 101. The substrate processing system 100 includes a plasma chamber 102 having a lower chamber portion 102b and an upper chamber portion 102a. A center column is configured to support a pedestal 140, which in one embodiment includes a powered lower electrode. The pedestal 140 is electrically coupled to a combiner and distributor 121, which is further coupled to multiple match networks 106. The match networks 106 are coupled to multiple radio frequency (RF) generators 104. The RF generators 104 are controlled by a probe control and system control 110, e.g., a controller, etc. Examples of a controller include a processor and a memory device. The processor, for example, is an application specific integrated circuit (ASIC), a programmable logic device (PLD), a central processing unit (CPU), or a microprocessor, etc. Examples of the memory device include a read-only memory (ROM), a random access memory (RAM), a redundant array of storage disks, a hard disk, a Flash memory, etc. The probe control and system control 110 operates the substrate processing system 100 by executing a process input and control 108. The process input and control 108 includes process recipes, such as power levels, timing parameters, process gasses, mechanical movement of the wafer 101, etc., so as to deposit or form films over the wafer 101.

The center column is also shown to include lift pins 120, which are controlled by a lift pin control 122. The lift pins 120 are used to raise the wafer 101 from the pedestal 140 to allow an end-effector to pick the wafer 101 and to lower the wafer 101 after being placed by the end end-effector. The substrate processing system 100 further includes a gas supply manifold 112 that is connected to process gases 114, e.g., gas chemistry supplies from a facility, etc. Depending on the processing being performed, the probe control and system control 110 controls a delivery of the process gases 114 via the gas supply manifold 112. The chosen gases are then flown into a shower head 150 and distributed in a space volume, e.g., a gap, etc., defined between the showerhead 150 face that faces that wafer 101 and the pedestal 140.

Further, in some embodiments, the process gases 114 are premixed or not. Appropriate valving and mass flow control mechanisms are employed to ensure that the correct process gases are delivered during deposition and plasma treatment phases of the process. The process gases 114 exit the plasma chamber 102 via an outlet. A vacuum pump, e.g., a one or two stage mechanical dry pump, a turbomolecular pump, etc., draws process gases out and maintains a suitably low pressure within the plasma chamber 102 by a close loop controlled flow restriction device, such as a throttle valve or a pendulum valve.

Also shown is a carrier ring 151 that encircles an outer region of the pedestal 140. The carrier ring 151 sits over a carrier ring support region that is a step down from a wafer support region in the center of the pedestal 140. The carrier ring 151 includes an outer edge side of its disk structure, e.g., outer radius, etc., and a wafer edge side of its disk structure, e.g., inner radius, etc., that is closest to where the wafer 101 sits. The wafer edge side of the carrier ring 151 includes a plurality of contact support structures which lift the wafer 101 when the carrier ring 151 is lifted by multiple spider forks 180. The carrier ring 151 is therefore lifted along with the wafer 101 and is rotated to another station, e.g., in a multi-station system.

In an embodiment, an upper electrode within the showerhead 150 is grounded when RF power is supplied from the RF generators 104 to the lower electrode within the pedestal 140.

In one embodiment, instead of the pedestal 140 being electrically coupled to the RF generators 104 via the match networks 106, the upper electrode within the showerhead 150 is coupled to the RF generators 104 via multiple match networks for receiving power from the RF generators 104 and the lower electrode within the pedestal 140 is grounded.

In some embodiments, the RF generators 104 generate RF signals having different frequencies, e.g., one of the RF generators 104 generates an RF signal having a low frequency and another one of the RF generators 104 generates an RF signal having a high frequency, which is higher than the low frequency.

Figure 2:
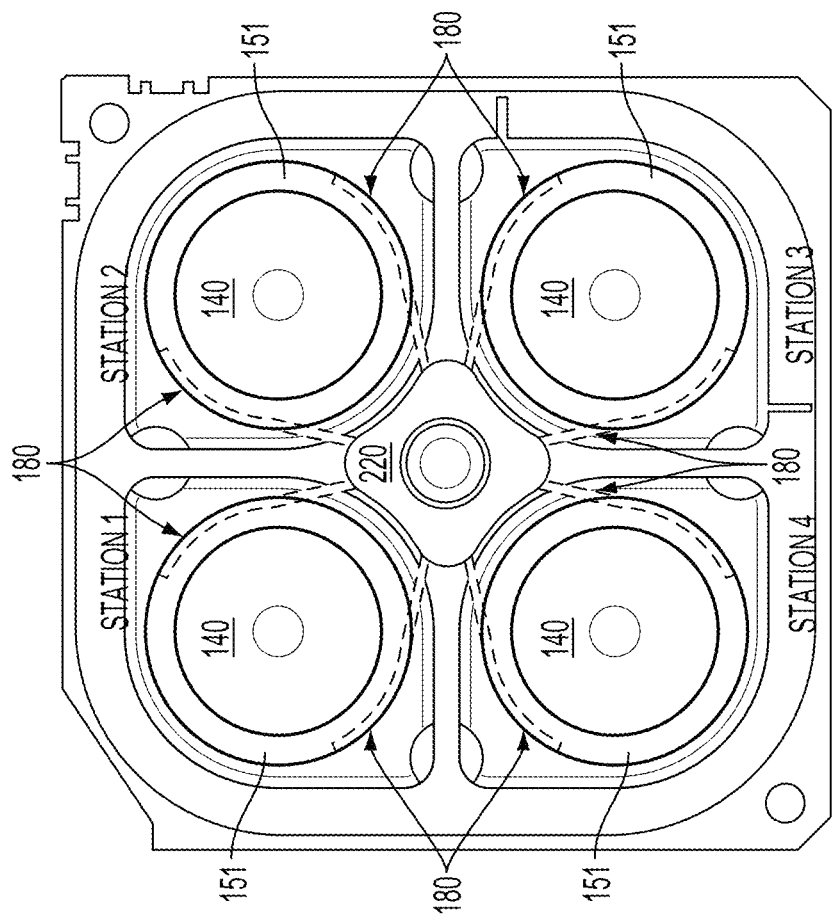
FIG. 2 illustrates a top view of a multi-station processing tool, where four processing stations are provided.

FIG. 2 illustrates a top view of a multi-station processing tool, where four processing stations, which are station 1, station 2, station 3, and station 4, are provided. The four stations are accessed by the spider forks 180. In one embodiment, there is no isolation wall or other mechanism to isolate one station from another. Each spider fork 180 includes a first and second arm, each of which is positioned around a portion of each side of the pedestal 140. In this view, the spider forks 180 are drawn in dash-lines, to convey that they are below the carrier ring 151. The spider forks 180, using an engagement and rotation mechanism 220, raise up and lift the carrier rings 151 from a lower surface of the carrier rings 151 from the stations 1 through 4 simultaneously, and then rotate between two or more stations 1 through 4 before lowering the carrier rings 151. During the rotation, at least one of the carrier rings 151 supports the wafer 101 to a next location so that further plasma processing, treatment and/or film deposition takes place on the wafer 101.

Figure 3:
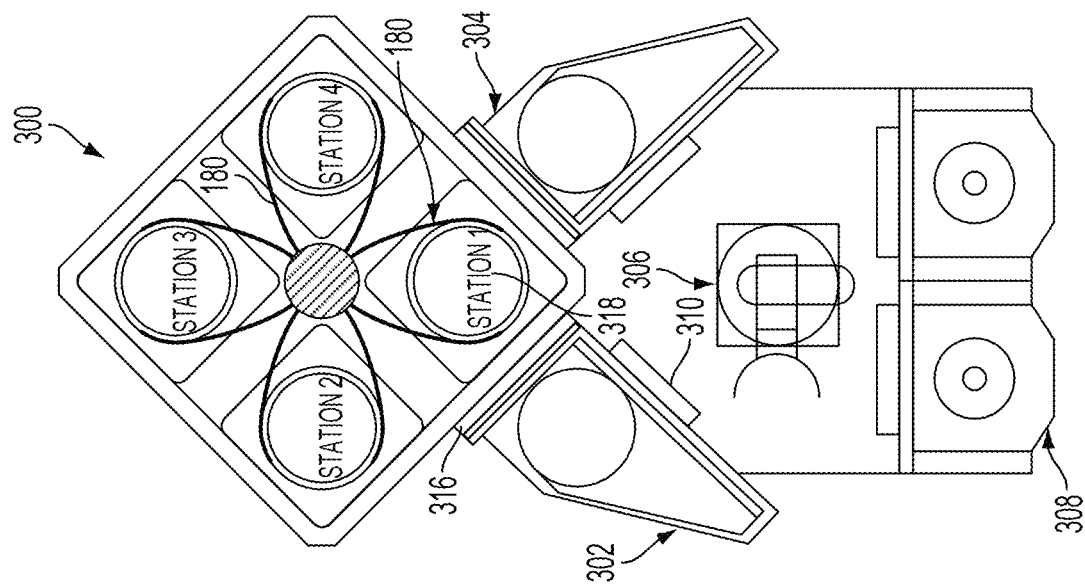
FIG. 3 shows a schematic view of an embodiment of a multi-station processing tool with an inbound load lock and an outbound load lock.

FIG. 3 shows a schematic view of an embodiment of a multi-station processing tool 300 with an inbound load lock 302 and an outbound load lock 304. A robot 306, at atmospheric pressure, moves substrates, e.g., the wafer 101, etc., from a cassette loaded through a pod 308 into the inbound load lock 302 via an atmospheric port 310. The inbound load lock 302 is coupled to a vacuum source (not shown) so that, when atmospheric port 310 is closed, the inbound load lock 302 is pumped down. The inbound load lock 302 also includes a chamber transport port 316 interfaced with one of the stations 1 through 4. Thus, when the chamber transport 316 is open, another robot (not shown) moves the wafer 101 from the inbound load lock 302 to the pedestal 140 of the station 1 for processing.

In some embodiments, a low pressure environment is maintained in an enclosure that encloses the stations 1 through 4 so that substrates are transferred using the carrier ring 151 among the stations 1 through 4 without experiencing a vacuum break and/or air exposure. Each of the stations 1 through 4 includes a process station substrate holder and process gas delivery line inlets.

The spider forks 180 transfer substrates among the stations 1 through 4. The spider forks 180 rotate and enable transfer of the wafer 101 from one of the stations 1 through 4 to another one of the stations 1 through 4. The transfer occurs by enabling the spider forks 180 to lift the carrier rings 151 from an outer undersurface, which lifts the wafer 101, and rotates the wafer 101 and the carrier ring 151 together to the next station. In one configuration, the spider forks 180 are made from a ceramic material to withstand high levels of heat during processing.

In various embodiments, a number of stations other than four is used. For example, three or two or five plasma processing stations are used to process the wafer 101.

Figure 4:
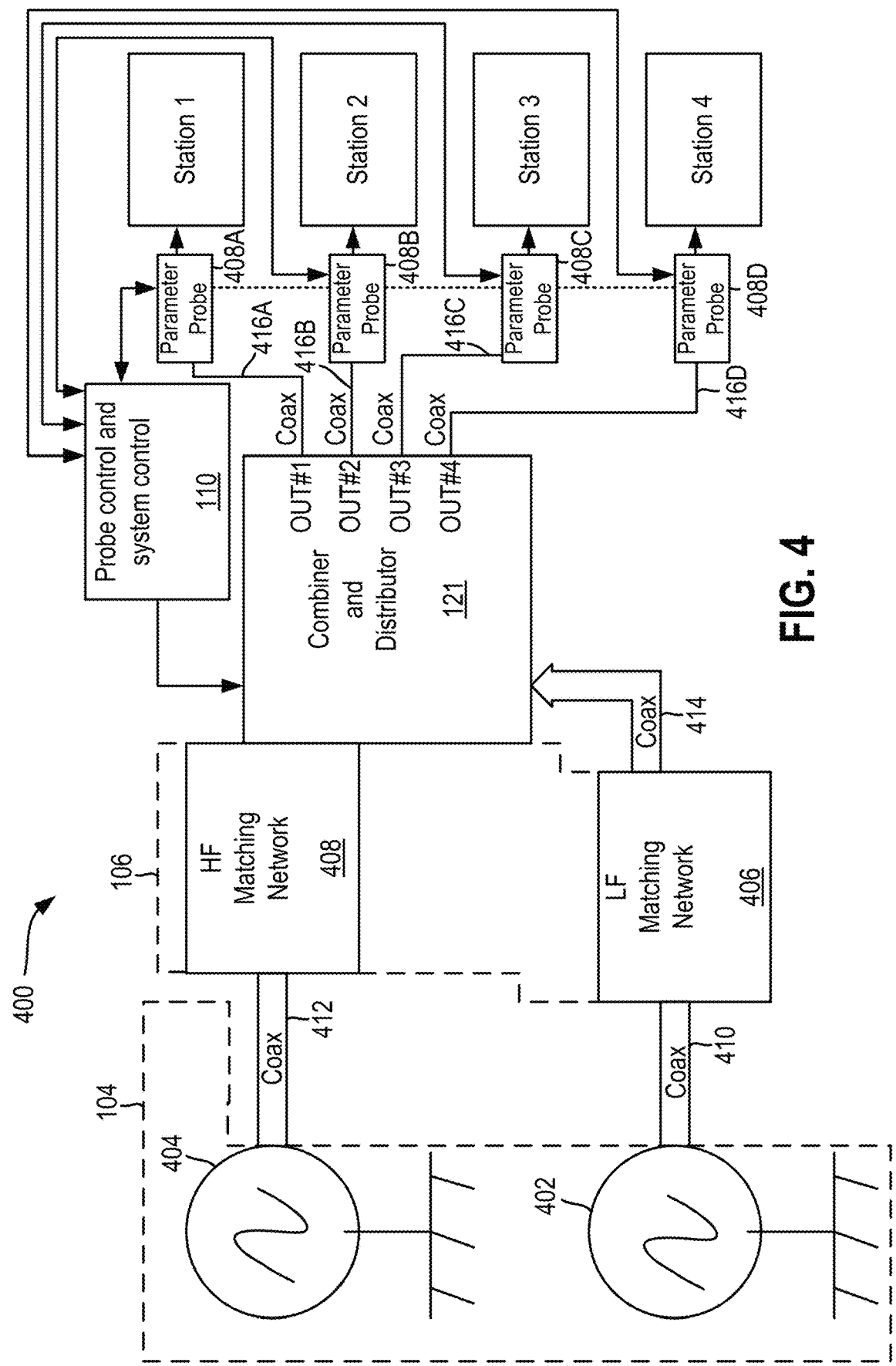
FIG. 4 is a diagram of an embodiment of a system for illustrating use of a combiner and distributor in combining and distributing radio frequency (RF) power to the stations.

FIG. 4 is a diagram of an embodiment of a system 400 for illustrating use of the combiner and distributor 121 in combining and distributing RF power to the stations 1 through 4. The system 400 includes a low frequency generator 402 and a high frequency generator 404. An example of the high frequency generator 404 includes an RF generator having an operating frequency of 13 megahertz (MHz) or 27 MHz or 60 MHz. An example of the low frequency generator 402 includes a generator having an operating frequency of 2 MHz or 400 kilohertz (kHz).

The system 400 further includes a low frequency matching network 406 and a high frequency matching network 408. An input of the low frequency matching network 406 is coupled to an output of the low frequency generator 402 via a coaxial cable 410 and an input of the high frequency matching network 408 is coupled to an output of the high frequency generator 404 via another coaxial cable 412. A matching network includes a circuit having one or more capacitors, one or more inductors, and/or one or more resistors.

An output of the low frequency matching network 406 is coupled via a coaxial cable 414 to the combiner and distributor 121 and an output of the high frequency matching network 438 is coupled to the combiner and distributor 121. For example, there is no coaxial cable coupling the output of the high frequency matching network 408 to the input of the combiner and distributor 121. In some embodiment, the coaxial cable couples the output of the high frequency matching network 408 to the input of the combiner and distributor 121.

A first output OUT#1 of the combiner and distributor 121 is coupled via a coaxial cable 416A to the station 1, e.g., the showerhead 150 of the station 1 or the pedestal 140 of the station 1, etc. Moreover, a second output OUT#2 of the combiner and distributor 121 is coupled via a coaxial cable 416B to the station 2, e.g., the showerhead 150 of the station 2 or the pedestal 140 of the station 2, etc. A third output OUT#3 of the combiner and distributor 121 is coupled via a coaxial cable 416C to the station 3, e.g., the showerhead 150 of the station 3 or the pedestal 140 of the station 3, etc. Moreover, a fourth output OUT#4 of the combiner and distributor 121 is coupled via a coaxial cable 416D to the station 4, e.g., the showerhead 150 of the station 4 or the pedestal 140 of the station 4, etc.

A parameter probe 408A is coupled to the OUT#1, a parameter probe 408B is coupled to the OUT#2, a parameter probe 408C is coupled to the OUT#3, and a parameter probe 408D is coupled to the OUT#4. The parameter probes 408A through 408D are coupled to the probe control and system control 110, which is further coupled to the combiner and distributor 121. Examples of a parameter probe include a complex voltage and current sensor, a complex voltage sensor, a complex current sensor, an impedance sensor, a direct current (DC) bias voltage sensor, a complex power probe, etc.

The low frequency generator 402 generates an RF signal having a frequency, e.g., 2 MHz frequency, 400 kHz frequency, etc., and provides the RF signal via the coax cable 410 to the input of the low frequency matching network 406. The low frequency matching network 406 matches an impedance of a load, e.g., the coaxial cable 414, the combiner and distributor 121, the coaxial cables 416A through 416D, and the stations 1 through 4, etc., that is coupled to the output of the low frequency matching network 406 with that of a source, e.g., the coaxial cable 410 and the low frequency generator 402, etc., that is coupled to the input of the low frequency matching network 406 to generate a modified RF signal upon receiving the RF signal from the low frequency RF generator 402.

Similarly, the high frequency generator 404 generates an RF signal having a frequency, e.g., 13 MHz frequency, 27 MHz frequency, 60 MHz frequency, etc., and provides the RF signal via the coax cable 412 to the input of the high frequency matching network 408. The high frequency matching network 408 matches an impedance of a load, e.g., the combiner and distributor 121, the coaxial cables 416A through 416D, and the stations 1 through 4, etc., that is coupled to the output of the high frequency matching network 408 with that of a source, e.g., the coaxial cable 412 and the high frequency generator 404, etc., that is coupled to the input of the high frequency matching network 408 to generate a modified RF signal upon receiving the RF signal from the high frequency RF generator 404.

The combiner and distributor 121 receives the modified RF signals from the low frequency matching network 406 and the high frequency matching network 408, and combines the RF signals to generate combined RF signals. One of the combined RF signals is sent via the OUT#1 to the station 1, another one of the combined RF signals is sent via the OUT#2 to the station 2, yet another one of the combined RF signals is sent via the OUT#3 to the station 3, and another one of the combined RF signals is sent via the OUT#4 to the station 4.

The parameter probe 408A measures a value of a parameter, e.g., complex voltage and current, DC bias voltage, complex impedance, complex power, etc., at the OUT#1 and provides the value to the probe control and system control 110. Moreover, the parameter probe 408B measures a value of the parameter at the OUT#2 and provides the value to the probe control and system control 110. The parameter probe 408C measures a value of the parameter at the OUT#3 and provides the value to the probe control and system control 110. The parameter probe 408D measures a value of the parameter at the OUT#4 and provides the value to the probe control and system control 110.

The processor of the probe control and system control 110 determines one or more values of a variable, e.g., capacitance, etc., of corresponding one or more tuning circuits of the combiner and distributor 121 based on the values of the parameter received from the parameter probes 408A through 408D. For example, the processor of the probe control and system control 110 determines that for a value of the parameter associated with the station 1 to be within a pre-determined range, e.g., same as, etc., of a value of the parameter associated with the station 2, a value of the variable of one of the tuning circuits of the combiner and distributor 121 is V1 and a value of the variable of another one of the tuning circuits of the combiner and distributor 121 is V2. The processor of the probe control and system control 110 controls the tuning circuits of the combiner and distributor 110 to achieve the values V1 and V2 of the variable to achieve the pre-determined range between the values of the parameter. As another example, a correspondence, e.g., a one-to-one matching, an association, a mapping, a row within a look-up table, etc., among values of the variable of all tuning circuits of the combiner and distributor 110 and values of the parameter at the outputs OUT#1 through OUT#4 is stored within the memory device that is coupled to the processor. Upon receiving a value of the parameter from the parameter probe 408A and a value of the parameter from the parameter probe 408B, the processor determines that the values are not within the pre-determined range from each other. The processor accesses the correspondence from the memory device to determine a value of the variable of one of the tuning circuits coupled to the OUT#1 and/or a value of the variable of one of the tuning circuits coupled to the OUT#2 so that the value of the parameter at the OUT#1 is within the pre-determined range from a value of the parameter of another one of the tuning circuits coupled to the OUT#2. The processor controls the value of the variable of the tuning circuit coupled to the OUT#1 and/or the value of the variable of the tuning circuit coupled to the OUT#2 so that the value of the parameter at the OUT#1 is within the pre-determined range from the value of the parameter at the OUT#2.

It should be noted that a number of the outputs of the combiner and distributor 121 match a number of the stations. For example, in case three stations are used to process the wafer 101, the combiner and distributor 121 has three outputs, where each output is coupled to a corresponding one of the stations.

In some embodiments, instead of the low frequency generator 402, a medium frequency generator is used. An example of the medium frequency generator includes an RF generator having an operating frequency of 1 MHz or 2 MHz. In these embodiments, the medium frequency generator generates an RF signal having the medium frequency. Moreover, instead of the low frequency matching network 406, a medium frequency matching network is used.

In various embodiments, a tool controller is coupled to the probe control and system control 110 to provide instructions to the probe control and system control 110 to perform the functions described herein, e.g., power distribution function, etc., as being performed by the probe control and system control 110.

In some embodiments, the probe control and system control 110 includes any number of controllers for performing the functions described herein as being performed by the probe control and system control 110 and the functions are distributed between the controllers. For example, the tool controller is a part of the probe control and system control 110.

In various embodiments, the combiner and distributor 121, the high frequency matching network 408, and the low frequency matching network 406 are remotely located from the stations 1 through 4. For example, a length of the each of the coax cables 416A through 416D ranges from four feet to six feet. As another example, a length of the each of the coax cables 416A through 416D ranges from six feet to eight feet.

In some embodiments, each of the coax cables 416A through 416D is a part of the combiner and distributor 121. For example, each of the coax cables 416A through 416D is not a 50 ohm RF transmission line. To illustrate, each of the coax cables 416A through 416D does not encounter an impedance of 50 ohms at its input and output. Rather, RF power being transferred via each of the coax cables 416A through 416D undergoes a change in voltage and current along a length of the coax cable. To illustrate, each of the coax cables 416A through 416D offers a series of capacitances and a series of inductances to an RF signal received from the corresponding outputs OUT#1, OUT#2, OUT#3, and OUT#4 and passing through the coax cable.

Figure 5:
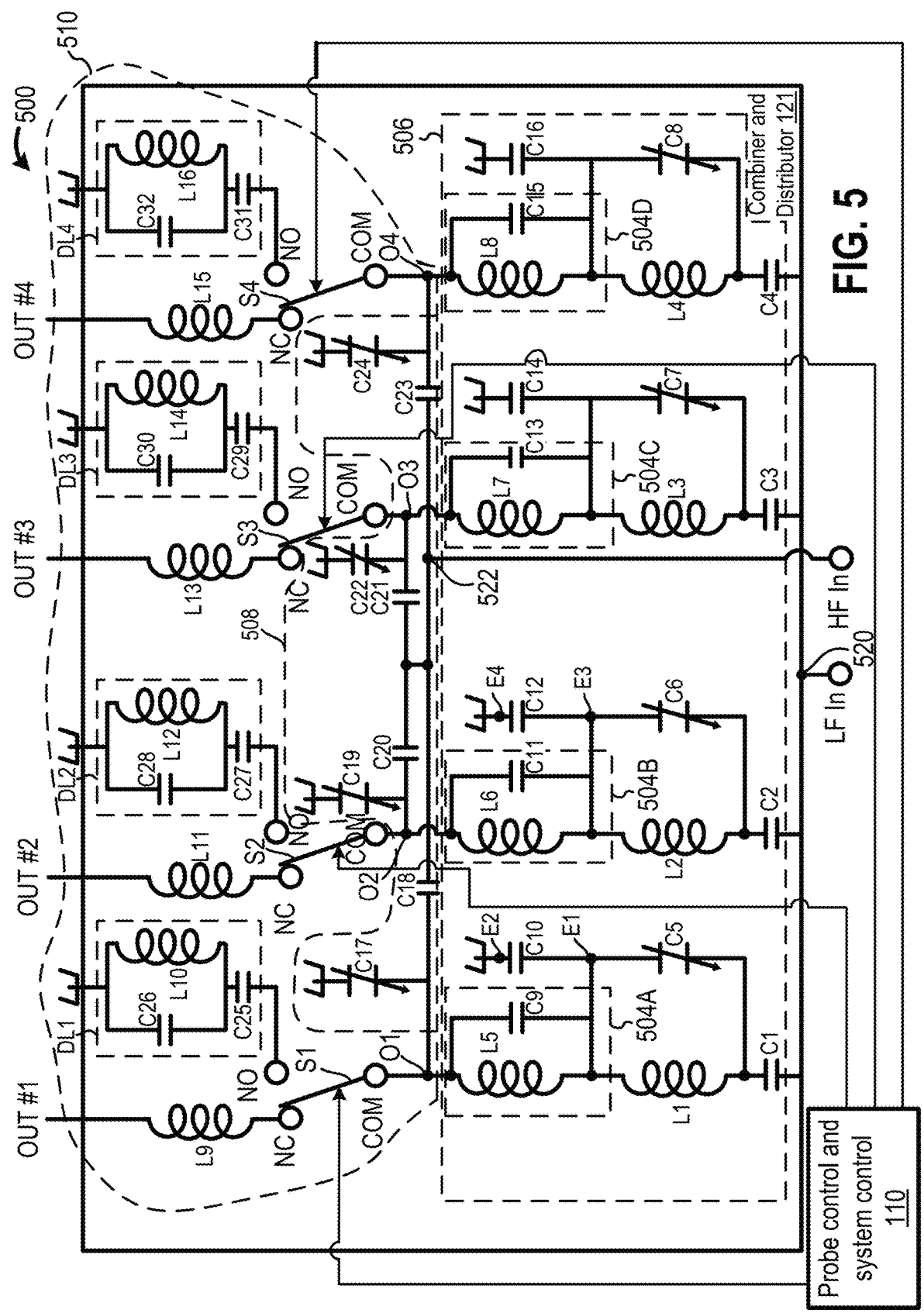
FIG. 5 is an embodiment of a system to illustrate a circuit diagram of an embodiment of the combiner and distributor.

FIG. 5 is an embodiment of a system 500 to illustrate a circuit diagram of an embodiment of the combiner and distributor 121. The system 500 includes the probe control and system control 110 and further includes the combiner and distributor 121.

The combiner and distributor 121 has a low frequency circuit 506, a high frequency circuit 508, and an output circuit 510. The low frequency circuit 506 is coupled to the high frequency circuit 508, which is further coupled to the output circuit 510. The low frequency circuit 506 includes DC blocking capacitors C1, C2, C3, and C4. The low frequency circuit 506 further includes multiple tuning circuits C5, C6, C7, and C8, which are variable capacitors, and the low frequency circuit 506 further includes inductors L1, L2, L3, and L4. The low frequency circuit 506 includes a high frequency blocking circuit 504A, a high frequency blocking circuit 504B, and a high frequency blocking circuit 504C, a high frequency blocking circuit 504D. The high frequency blocking circuit 504A includes an inductor L5 coupled in parallel with a capacitor C9. For example, an end of the inductor L5 is connected to an output O1 and an opposite end of the inductor L5 is connected to an end E1.

Moreover, in the example, an end of the capacitor C9 is connected to the output O1 and an opposite end of the capacitor C9 is connected to the end E1. Similarly, the high frequency blocking circuit 504B includes an inductor L6 coupled in parallel with a capacitor C11, the high frequency blocking circuit 504C includes an inductor L7 coupled in parallel with a capacitor C14, and the high frequency blocking circuit 504D includes an inductor L8 coupled in parallel with a capacitor C15. For example, an end of the inductor L6 is connected to an output O2 and an opposite end of the inductor L6 is connected to an end E3. Moreover, in the example, an end of the capacitor C11 is connected to the output O2 and an opposite end of the capacitor C11 is connected to the end E3. The low frequency circuit 506 further includes capacitors C10, C12, C14, and C16.

The high frequency circuit 508 has capacitors C18, C20, C21, and C23. The high frequency circuit 508 further includes tuning circuits C17, C19, C22, and C24, which are variable capacitors. In some embodiments, each of the variable capacitors C5, C6, C7, C8, C17, C19, C22, and C24 is a vacuum capacitor.

The output circuit 510 includes dummy loads DL1, DL2, DL3, and DL4, and further includes balancing inductors L9, L11, L13, and L15. The output circuit 510 includes switches S1, S2, S3, and S4. An example of a switch includes a transistor or a combination of one or more transistors.

The dummy load DL1 includes a capacitor C26 coupled in parallel to an inductor L10, and further includes a DC blocking capacitor C25. Similarly, the dummy load DL2 includes a capacitor C28 coupled in parallel to an inductor L12, and further includes a DC blocking capacitor C27. Also, the dummy load DL3 includes a capacitor C30 coupled in parallel to an inductor L14, and further includes a DC blocking capacitor C29. The dummy load DL4 includes a capacitor C32 coupled in parallel to an inductor L16, and further includes a DC blocking capacitor C31. Each of the DC blocking capacitors C25, C27, C29, and C30 blocks DC power from reaching the corresponding capacitors C26, C28, C29, and C32, and the corresponding inductors L10, L12, L14, and L16 of the dummy loads DL1 through DL4. To illustrate, the DC blocking capacitor C25 blocks the DC power from being transferred from the plasma of the station 1 via the OUT#1 to the capacitor C26 and the inductor L10. The DC power is received from the plasma generated within the corresponding stations 1 through 4. For example, the DC power blocked by the DC block capacitor C25 is generated by wafer DC bias created by plasma in the station 1 and the DC power blocked by the DC blocking capacitor C27 is generated by wafer DC bias created by plasma in the station 2.

The capacitors C1 through C4 are coupled via an input 520 of the low frequency circuit 506 to the low frequency matching network 406 (FIG. 4) to receive the modified RF signal of the low frequency from the low frequency matching network 406 via the coaxial cable 414 (FIG. 4) and the input 520. The capacitors C1 through C4 block the DC power received from plasma generated within the stations 1 through 4 from reaching the low frequency RF generator 402 (FIG. 4) via the input 520, the coaxial cable 414, the low frequency matching network 406, and the coaxial cable 410 (FIG. 4). For example, the capacitor C1 blocks power generated by wafer DC bias created by plasma within the station 1 and the capacitor C2 blocks power generated by wafer DC bias created by plasma within the station 2.

Each of the inductors L1 through L4 acts as a capacitor at the high frequency. The high frequency blocking circuits 504A through 504D blocks the high frequency of the modified RF signal of the high frequency received from the high frequency matching network 408 (FIG. 4) via an input 522 of the high frequency circuit 510 from reaching the low frequency RF generator 402 via the input 520, the coaxial cable 414, the low frequency matching network 406, and the coaxial cable 410. For example, the high frequency blocking circuit 504A blocks the high frequency of the modified RF signal received via the input 522 from reaching via the inductor L1, the capacitor C1, the input 520, the coaxial cable 414, the low frequency matching network 406, and the coaxial cable 410 to the low frequency RF generator 402.

The capacitors C10, C12, C14, and C16 provide a path to ground for any residual high frequency power leaked from the corresponding high frequency blocking circuits 504A through 504D. For example, the capacitor C10 is coupled to a ground connection at one end E2 and to the high frequency blocking circuit 504A at the opposite end E1. As another example, the capacitor C12 is coupled to a ground connection at one end E4 and to the high frequency blocking circuit 504B at the opposite end E3. One or more capacitances of corresponding one or more of the variable capacitors C5 through C8 are changed so that the values of the parameter at two or more of the outputs OUT#1, OUT#2, OUT#3, and OUT#4 are within the pre-determined range from each other. Similarly, one or more capacitances of corresponding one or more of the variable capacitors C17, C19, C22, and C24 are changed so that the values of the parameter at two or more of the outputs OUT#1, OUT#2, OUT#3, and OUT#4 are within the pre-determined range from each other. In some embodiments, one or more of the capacitances of corresponding one or more of the variable capacitors C5, C6, C7, C8, C17, C19, C22, and C24 are changed so that the values of the parameter at two or more of the outputs OUT#1, OUT#2, OUT#3, and OUT#4 are within the pre-determined range from each other. The capacitors C18, C20, C21, and C23 filter out the low frequency of the modified RF signal received from the low frequency matching network 406 via the coaxial cable 414 and the input 520. For example, the capacitor C18 filters out the low frequency of the modified RF signal received from the low frequency matching network 406 via the coaxial cable 414, the input 520, the capacitor C1, the inductor L1, and the high frequency blocking circuit 504A.

Each of the switches S1 through S4 is open, e.g., normally open (NO), etc., by being coupled to a normally open terminal of the switch or closed, e.g., normally closed (NC), etc., by being coupled to a normally closed terminal of the switch. Each of the switches S1 through S4 is open or closed with respect to a common terminal (COM) of the switch. For example, when an off signal, e.g. an amount of current less than a pre-specified amount, etc., is sent from the processor to the switch S1, the switch S1 is in the open position, e.g., an off state, etc. Moreover, when an on signal, e.g. an amount of current greater than the pre-specified amount, etc., is sent from the processor to the switch S1, the switch is in the closed position, e.g., an on state, etc.

The switches S1 through S4 are coupled to the probe control and system control 110 to be controlled by the probe control and system control 110. The switches S1 through S4 are controlled to be in the open or close position upon receiving a control signal from the processor of the probe control and system control 110. For example, the switch S1 closes to couple the output O1 of the low frequency circuit 506 and the high frequency circuit 508 to the station 1 via the inductor L9 and the OUT#1 of the output circuit 510 so that plasma is enabled, e.g., generated, maintained, etc., within the station 1. As another example, the switch S2 closes to couple the output O2 of the low frequency circuit 506 and the high frequency circuit 508 to the station 2 via the inductor L11 and the OUT#2 of the output circuit 510 so that plasma is enabled within the station 2. As yet another example, the switch S3 closes to couple an output O3 of the low frequency circuit 506 and the high frequency circuit 508 to the station 3 via the inductor L13 and the OUT#3 of the output circuit 510 so that plasma is enabled within the station 3. As another example, the switch S4 closes to couple an output O4 of the low frequency circuit 506 and the high frequency circuit 508 to the station 4 via the inductor L15 and the OUT#4 of the output circuit 510 so that plasma is enabled within the station 4. As another example, the switch S1 is open to couple the output O1 of the low frequency circuit 506 and the high frequency circuit 508 to the dummy load DL1 so that plasma is disabled, e.g., not generated, turned off, etc., within the station 1. As another example, the switch S2 is open to couple the output O2 of the low frequency circuit 506 and the high frequency circuit 508 to the dummy load DL2 so that plasma is disabled within the station 2. As yet another example, the switch S3 is open to couple the output O3 of the low frequency circuit 506 and the high frequency circuit 508 to the dummy load DL3 so that plasma is disabled within the station 3. As another example, the switch S4 is open to couple the output O4 of the low frequency circuit 506 and the high frequency circuit 508 to the dummy load DL4 so that plasma is disabled within the station 4.

By switching RF power to one or more of the stations 1 through 4, power is selectively diverted to the one or more stations 1 through 4 to enable plasma in the one or more of the stations 1 through 4. For example, the switch S1 is controlled by the probe control and system control 110 to be in the closed position so that RF power of the combined RF signal at the output O1 is sent to the station 1 via the inductor L9, the OUT#1, and the coaxial cable 416A (FIG. 4) to enable plasma within the station 1. As another example, the switch S2 is controlled by the probe control and system control 110 to be in the closed position so that RF power of the combined RF signal at the output O2 is sent to the station 2 via the inductor L11, the OUT#2, and the coaxial cable 416B (FIG. 4) to enable plasma within the station 2. As yet another example, the switch S3 is controlled by the probe control and system control 110 to be in the closed position so that RF power of the combined RF signal at the output O3 is sent to the station 3 via the inductor L13, the OUT#3, and the coaxial cable 416C (FIG. 4) to enable plasma within the station 3. As another example, the switch S4 is controlled by the probe control and system control 110 to be in the closed position so that RF power of the combined RF signal at the output O4 is sent to the station 4 via the inductor L15, the OUT#4, and the coaxial cable 416D (FIG. 4) to enable plasma within the station 4.

On one hand, when the station 1 is to be used for plasma processing, e.g., ignite, enable, or control plasma, etc., RF power to the station 1 is diverted from the dummy load DL1 to the station 1. For example, when the station 1 is to be used for processing the wafer 101, the switch S1 is controlled by the probe control and system control 110 to close the switch S1 so that RF power of the combined RF signal at the output O1 is diverted to the station 1 via the inductor L9 and the OUT#1. On the other hand, when one of the stations 1 through 4 is not to be used for plasma processing, RF power to the station is diverted to a dummy load corresponding to the station. For example, when the station 1 is not to be used for processing the wafer 101, the switch S1 is controlled by the probe control and system control 110 to open the switch S1 so that RF power of the combined RF signal at the output O1 is diverted to the dummy load DL1. There is no need to turn off, e.g., power off, remove power from, etc., one or both of the low frequency RF generator 402 and the high frequency RF generator 404 to remove RF power to the station 1.

In various embodiments, the outputs O1 through O4 are parts of the output circuit 510.

In some embodiments, the dummy load DL1 has an impedance that is within a pre-determined limit, e.g., same as, etc., from an impedance of the station 1, the dummy load DL2 has an impedance that is within the pre-determined limit from an impedance of the station 2, the dummy load DL3 has an impedance that is within the pre-determined limit from an impedance of the station 3, and the dummy load DL4 has an impedance that is within the pre-determined limit from an impedance of the station 4.

The modified RF signal that is received at the input 520 from the low frequency matching network 406 (FIG. 4) is processed by the inductors L1 through L4, the capacitors C5 through C8, the high frequency blocking circuits 504A through 504D, and the capacitors C10, C12, C14, and C16 to provide RF signals at the outputs O1 through O4. For example, a portion of the modified RF signal that is received at the input 520 is processed by the capacitor C1, the inductor L1, the capacitor C5, the high frequency blocking circuit 504A, and the capacitor C10 to provide an RF signal of the low frequency at the output O1. As another example, a portion of the modified RF signal that is received at the input 520 is processed by the capacitor C2, inductor L2, the capacitor C6, the high frequency blocking circuit 504B, and the capacitor C12 to provide an RF signal of the low frequency at the output O2. As yet another example, a portion of the modified RF signal that is received at the input 520 is processed by the capacitor C3, inductor L3, the capacitor C7, the high frequency blocking circuit 504C, and the capacitor C14 to provide an RF signal of the low frequency at the output O3. As still another example, a portion of the modified RF signal that is received at the input 520 is processed by the capacitor C4, inductor L4, the capacitor C8, the high frequency blocking circuit 504D, and the capacitor C16 to provide an RF signal of the low frequency at the output O4.

Similarly, the modified RF signal that is received at the input 522 from the high frequency matching network 408 (FIG. 4) is processed by the capacitors C17 through C24 to provide RF signals at the outputs O1 through O4 within the combiner and distributor 121. For example, a portion of the modified RF signal of the high frequency that is received at the input 522 is processed by the capacitors C17 and C18 to provide an RF signal of the high frequency at the output O1. As another example, a portion of the modified RF signal of the high frequency that is received at the input 522 is processed by the capacitors C19 and C20 to provide an RF signal of the high frequency at the output O2. As yet another example, a portion of the modified RF signal of the high frequency that is received at the input 522 is processed by the capacitors C21 and C22 to provide an RF signal of the high frequency at the output O3. As still another example, a portion of the modified RF signal of the high frequency that is received at the input 522 is processed by the capacitors C23 and C24 to provide an RF signal of the high frequency at the output O4.

The RF signals received at the outputs O1 through O4 from the low frequency circuit 506 and the high frequency circuit 508 are combined at the outputs O1 through O4 to provide the combined RF signals at the outputs O1 through O4. For example, the RF signal received at the output O1 from the low frequency circuit 506 is summed at the output O1 with the RF signal received at the output O1 from the high frequency circuit 508 to generate the combined RF signal at the output O1. As another example, the RF signal received at the output O2 from the low frequency circuit 506 is summed at the output O2 with the RF signal received at the output O2 from the high frequency circuit 508 to generate the combined RF signal at the output O2. As yet another example, the RF signal received at the output O3 from the low frequency circuit 506 is summed at the output O3 with the RF signal received at the output O3 from the high frequency circuit 508 to generate the combined RF signal at the output O3. As another example, the RF signal received at the output O4 from the low frequency circuit 506 is summed at the output O4 with the RF signal received at the output O4 from the high frequency circuit 508 to generate the combined RF signal at the output O4.

The combined RF signal generated at the output O1 is sent from the output O1 via the switch S1 in the closed position, the balancing inductor L9, and the OUT#1 to the station 1 for plasma processing of the wafer 101 at the station 1 or is sent via the switch S1 in the open position to the dummy load DL1. Similarly, the combined RF signal generated at the output O2 is sent from the output O2 via the switch S2 in the closed position, the balancing inductor L11, and the OUT#2 to the station 2 for plasma processing of the wafer 101 at the station 2 or is sent via the switch S2 in the open position to the dummy load DL2. Moreover, the combined RF signal generated at the output O3 is sent from the output O3 via the switch S3 in the closed position, the balancing inductor L13, and the OUT#3 to the station 3 for plasma processing of the wafer 101 at the station 3 or is sent via the switch S3 in the open position to the dummy load DL3. Also, the combined RF signal generated at the output O4 is sent from the output O4 via the switch S4 in the closed position, the balancing inductor L15, and the OUT#4 to the station 4 for plasma processing of the wafer 101 at the station 4 or is sent via the switch S4 in the open position to the dummy load DL4.

The balancing inductor L9 changes a resonant frequency of circuits, e.g., the showerhead 150 of the station 1 and the pedestal of the station 1, etc., so that the circuits resonate within a pre-determined range from a pre-defined operating frequency to ignite plasma within the station 1 quickly. Similarly, the balancing inductor L11 changes a resonant frequency of circuits, e.g., the showerhead 150 of the station 2 and the pedestal of the station 2, etc., so that the circuits resonate within a pre-determined range from the pre-defined operating frequency to ignite plasma within the station 2 quickly. Also, the balancing inductor L13 changes a resonant frequency of circuits, e.g., the showerhead 150 of the station 3 and the pedestal of the station 3, etc., so that the circuits resonate within a pre-determined range from the pre-defined operating frequency to ignite plasma within the station 3 quickly. Furthermore, the balancing inductor L15 changes a resonant frequency of circuits, e.g., the showerhead 150 of the station 4 and the pedestal of the station 4, etc., so that the circuits resonate within a pre-determined range from the pre-defined operating frequency to ignite plasma within the station 4 quickly. The pre-defined operating frequency is a frequency of operation of the low frequency generator 402 when operational or a combination of the frequency of operation of the low frequency generator 402 when operational and a frequency of operation of the high frequency generator 404 when operational. Further description of a balancing inductor is provided in U.S. Pat. No. 6,199,506, which is incorporated by reference herein in its entirety.

In case one of the combined RF signals is not to be provided to one of the stations 1 through 4, a corresponding one of the outputs O1 through O4 is coupled to a corresponding one of the dummy loads DL1 through DL4. For example, when one of the combined RF signals is to not to be provided to the station 1, the processor of the probe control and system control 110 sends a signal to the switch S1 to open the switch S1 to couple the output O1 to the dummy load DL1. The dummy load DL1 has the impedance within the pre-determined limit from the impedance of the station 1 so that the other stations 2 through 4 that receive the other combined RF signals via the outputs OUT#2 through OUT#4 do not see a change in impedance at their corresponding inputs.

In some embodiments, positions, e.g., open position, closed position, etc., of the switches S1 through S4 are monitored and controlled to achieve a process parameter, examples of which are provided below. For example, a sensor, e.g., a voltage sensor, a current sensor, etc., is coupled to the normally closed terminal or to the normally open terminal of the switch to determine whether the switch is in the open or close position. The sensor is coupled to the processor of the probe control and system control 10 via a transfer cable, such as a serial transfer cable, a parallel transfer cable, or a universal serial bus (USB) cable. The sensor provides the position of the switch to the processor via the transfer cable. The processor determines whether the position corresponds to a pre-determined process parameter, e.g., pressure, temperature, etch rate, deposition rate, complex power, etc. Upon determining that the position does not correspond to the pre-determined process parameter, the processor changes the position of the switch so that the position corresponds to the pre-determined process parameter. The correspondence, e.g., one-to-one relationship, mapping, etc., between the pre-determined process parameter and a position of the switch is stored in the memory device. In this manner, positions of one or more the switches S1 through S4 are monitored and controlled to achieve the pre-determined process parameter that corresponds to the positions of the one or more of the switches S1 through S4.

In some embodiments, closing or openings of the switches S1 through S4 is synchronized, e.g., occurs at the same time, occurs within a pre-determined time range, etc., to enable or disable power to the stations 1 through 4 in a synchronous manner. For example, the processor sends a signal to one or more of the switches S1 through S4 synchronously, e.g., at the same time, within the pre-determined time range, etc., to close the switches or to open the switches synchronously.

Figure 6:
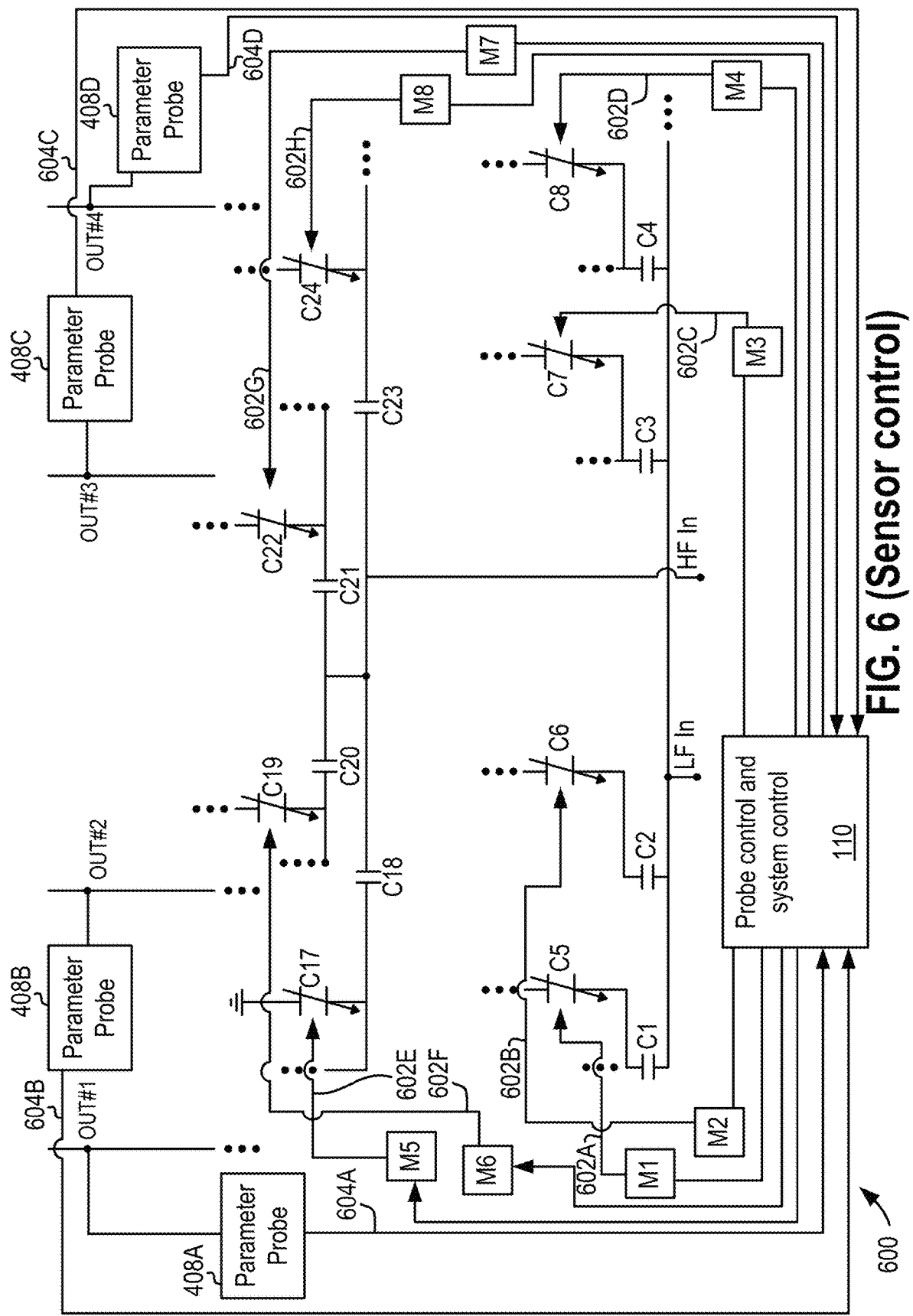
FIG. 6 is a diagram of an embodiment of a system to illustrate control of tuning elements of the combiner and distributor by a probe control and system control.

FIG. 6 is a diagram of an embodiment of a system 600 to illustrate control of the tuning elements of the combiner and distributor 121 by the probe control and system control 110. The system 600 includes the combiner and distributor 121, a portion of which is illustrated, the parameter probes 408A through 408D, and multiple motors M1, M2, M3, M4, M5, M6, M7, and M8. The motor M1 is coupled to the capacitor C5 via a connection mechanism 602A. Similarly, the motor M2 is coupled to the capacitor C6 via a connection mechanism 602B, the motor M3 is coupled to the capacitor C7 via a connection mechanism 602C, and the motor M4 is coupled to the capacitor C8 via a connection mechanism 602D. Moreover, the motor M5 is coupled to the capacitor C17 via a connection mechanism 602E, the motor M6 is coupled to the capacitor C19 via a connection mechanism 602F, the motor M7 is coupled to the capacitor C22 via a connection mechanism 602G, and the motor M8 is coupled to the capacitor C24 via a connection mechanism 602H. Examples of a connection mechanism include one or more rods, or a combination of multiple rods and one or more gears, etc.

The parameter probe 408A is coupled to the probe control and system control 110 via a transfer cable 604A, e.g., a serial transfer cable, a parallel transfer cable, a universal serial bus (USB) cable, etc. Similarly, the parameter probe 408B is coupled to the probe control and system control 110 via a transfer cable 604B, the parameter probe 408C is coupled to the probe control and system control 110 via a transfer cable 604C, and the parameter probe 408C is coupled to the probe control and system control 110 via a transfer cable 604D.

The parameter probe 408A is coupled to the OUT#1, the parameter probe 408B is coupled to the OUT#2, the parameter probe 408C is coupled to the OUT#3, and the parameter probe 408D is coupled to the OUT#4. The parameter probe 408A provides a value of the parameter measured by the parameter probe 408A at the OUT#1 via the transfer cable 604A to the probe control and system control 110. Similarly, the parameter probe 408B provides a value of the parameter measured by the parameter probe 408B at the OUT#2 via the transfer cable 604B to the probe control and system control 110. Moreover, the parameter probe 408C provides a value of the parameter measured by the parameter probe 408C at the OUT#3 via the transfer cable 604C to the probe control and system control 110. The parameter probe 408D provides a value of the parameter measured by the parameter probe 408D at the OUT#4 via the transfer cable 604D to the probe control and system control 110.

When RF power of the combined RF signals is on, e.g., is being provided to the stations 1 through 4 via the outputs OUT#1, OUT#2, OUT#3, and OUT#4, etc., process parameters, e.g., the parameter as described above, pressure within the stations 1 through 4, temperature within the stations 1 through 4, etc., are changing insitu. Moreover, when the RF power of the combined RF signal is on, plasma is generated and maintained in the stations 1 through 4 and the processor of the probe control and system control 110 receives the values of the parameter from the parameter probes 408A through 408D and determines whether one or more of capacitances of corresponding one of more of the capacitors C5, C6, C7, C8, C17, C19, C22, and C24 are to be changed so that the values of the parameter at the OUT#1, OUT#2, OUT#3, and OUT#4 are minimized, e.g., are within the pre-determined range from each other, etc. For example, the processor compares the value of the parameter received from the parameter probe 408A with the value of the parameter received from the parameter probe 408B, and determines whether the values are within the pre-determined range from each other. Upon determining that the values are not within the pre-determined range, the processor accesses the correspondence stored in the memory device of the probe control and system control 110 to identify one or more values of capacitances of the corresponding one or more capacitors C5, C6, C17, and C19. Upon identifying the one or more values, the processor generates an amount of current to drive the motor M1 so that the identified value of the capacitance of the capacitor C5 is achieved. To illustrate, an amount of drive current is sent from the processor to a stator of the motor M1. Upon receiving the drive current, the stator generates an electric field to rotate a rotor of the motor M1 to drive the motor M1. The motor M1 is driven to rotate a plate of the capacitor C5 or to change a distance between plates of the capacitor C5 to achieve the identified value of the capacitance of the capacitor C5. The change in the capacitance of the capacitor C5 changes a level, e.g., amount, peak-to-peak magnitude, root mean square (RMS) value, etc., of power of an RF signal of the low frequency that is output from the capacitor C5 to further change a level of power of the RF signal having the low frequency at the output O1 to further change a level of power of the combined RF signal provided from the OUT#1 to the station 1. In some embodiments, the change in the capacitance of the capacitor C5 changes a phase of the RF signal of the low frequency that is output from the capacitor C5 to further change a phase of the RF signal having the low frequency at the output O1 to further change a phase of the combined RF signal provided from the OUT#1 to the station 1. In various embodiments, the change in the capacitance of the capacitor C5 changes the level of power and the phase of the RF signal of the low frequency that is output from the capacitor C5 to further change the level of power and the phase of the RF signal having the low frequency at the output O1 to further change the level of power and the phase of the combined RF signal provided from the OUT#1 to the station 1.

Similarly, upon identifying the one or more values of the capacitances of the corresponding one or more capacitors C5, C6, C17, and C19, the processor generates an amount of current to drive the motor M2 so that the identified value of the capacitance of the capacitor C6 is achieved. The change in the capacitance of the capacitor C6 changes a level of power of an RF signal of the low frequency that is output from the capacitor C6 to further change a level of power of the RF signal having the low frequency at the output O2 to further change a level of power of the combined RF signal provided from the OUT#2 to the station 2. In some embodiments, the change in the capacitance of the capacitor C6 changes a phase of an RF signal of the low frequency that is output from the capacitor C6 to further change a phase of the RF signal having the low frequency at the output O2 to further change a phase of the combined RF signal provided from the OUT#2 to the station 2. In various embodiments, the change in the capacitance of the capacitor C6 changes the level of power and the phase of the RF signal of the low frequency that is output from the capacitor C6 to further change the level of power and the phase of the RF signal having the low frequency at the output O2 to further change the level of power and the phase of the combined RF signal provided from the OUT#2 to the station 2.

Moreover, similarly, upon identifying the one or more values of capacitances of the corresponding one or more capacitors C5, C6, C17, and C19, the processor generates an amount of current to drive the motor M5 so that the identified value of the capacitance of the capacitor C17 is achieved. The change in the capacitance of the capacitor C17 changes a level of power of an RF signal of the high frequency that is output from the capacitor C17 to further change a level of power of the RF signal having the high frequency at the output O1 to further change a level of power of the combined RF signal provided from the OUT#1 to the station 1. In some embodiments, the change in the capacitance of the capacitor C17 changes a phase of an RF signal of the high frequency that is output from the capacitor C17 to further change a phase of the RF signal having the high frequency at the output O1 to further change a phase of the combined RF signal provided from the OUT#1 to the station 1. In various embodiments, the change in the capacitance of the capacitor C17 changes the level of power and the phase of an RF signal of the high frequency that is output from the capacitor C17 to further change the level of power and the phase of the RF signal having the high frequency at the output O1 to further change the level of power and the phase of the combined RF signal provided from the OUT#1 to the station 1.

Furthermore, similarly, upon identifying the one or more values of capacitances of the corresponding one or more capacitors C5, C6, C17, and C19, the processor generates an amount of current to drive the motor M6 so that the identified value of the capacitance of the capacitor C19 is achieved. The change in the capacitance of the capacitor C19 changes a level of power of an RF signal of the high frequency that is output from the capacitor C19 to further change a level of power of the RF signal having the high frequency at the output O2 to further change a level of power of the combined RF signal provided from the OUT#2 to the station 2. In some embodiments, the change in the capacitance of the capacitor C19 changes a phase of the RF signal of the high frequency that is output from the capacitor C19 to further change a phase of the RF signal having the high frequency at the output O2 to further change a phase of the combined RF signal provided from the OUT#2 to the station 2. In various embodiments, the change in the capacitance of the capacitor C19 changes the level of power and the phase of an RF signal of the high frequency that is output from the capacitor C19 to further change the level of power and the phase of the RF signal having the high frequency at the output O2 to further change the level of power and the phase of the combined RF signal provided from the OUT#2 to the station 2. In this manner, one or more of the capacitances of the capacitors C5, C6, C17, and C19 are changed until the values of the parameter at the OUT#1 and OUT#2 are within the pre-determined range from each other.

In various embodiments, an association, e.g., a one-to-one-relationship, a mapping, etc., between an amount of current to drive a motor that is coupled to a capacitor of the combiner and distributor 121 and a capacitance of the capacitor achieved with the amount of current are stored within the correspondence that is stored in the memory device.

In some embodiments, the processor of the probe control and system control 110 receives the values of the parameter from the parameter probes 408A through 408D and determines whether one or more of capacitances of corresponding one or more of the capacitors C5, C6, C7, C8, C17, C19, C22, and C24 are to be changed so that the value of the parameter at the OUT#1 is within a first pre-set range, the value of the parameter at the OUT#2 is within a second pre-set range, the value of the parameter at the OUT#3 is within a third pre-set range, and the value of the parameter at the OUT#4 is within a fourth pre-set range. For example, the processor receives the value of the parameter received from the parameter probe 408A, and determines whether the value is within the first pre-set range. Upon determining that the value is not within the first pre-set range, the processor accesses the correspondence stored in the memory device of the probe control and system control 110 to identify one or more values of capacitances the corresponding one or more capacitors C5 and C17 until the value is within the first pre-set range.

In these embodiments, upon identifying the one or more values of capacitances of the corresponding one or more capacitors C5 and C17, the processor generates an amount of current to drive the motor M1 so that the identified value of the capacitance of the capacitor C5 is achieved. To illustrate, an amount of drive current is sent from the processor to the stator of the motor M1. The amount of drive current changes the capacitance of the capacitor to C5 changes a level and/or phase of power of an RF signal of the low frequency that is output from the capacitor C5 to further change a level and/or phase of power of the RF signal having the low frequency at the output O1 to further change a level and/or phase of power of the combined RF signal provided from the OUT#1 to the station 1 to achieve the first pre-set range. Similarly, upon identifying the one or more values, the processor generates an amount of current to drive the motor M5 so that the identified value of the capacitance of the capacitor C17 is achieved. The change in the capacitance of the capacitor C17 changes a level and/or phase of power of an RF signal of the high frequency that is output from the capacitor C17 to further change a level and/or phase of power of the RF signal having the high frequency at the output O1 to further change a level and/or phase of power of the combined RF signal provided from the OUT#1 to the station 1. In this manner, one or more of the capacitances of the capacitors C5 and C17 are changed until the value of the parameter at the OUT#1 is within the first pre-set range. Process variability is achieved by achieving the value of the parameter at the OUT#1 to be within the first pre-set range, and/or the value of the parameter at the OUT#2 to be within the second pre-set range, and/or the value of the parameter at the OUT#3 to be within the third pre-set range, and/or the value of the parameter at the OUT#4 to be within the fourth pre-set range.

In various embodiments, when the value of the parameter at the OUT#1 is within the first pre-set range and the value of the parameter at the OUT#2 is within the second pre-set range, the values of the parameter at the OUT#1 and OUT#2 are within the pre-determined range from each other. Again, process variability is achieved when the values of the parameter at the OUT#1 and OUT#2 are within the pre-determined range from each other. Similarly, in some embodiments, process variability is achieved when the values of the parameter at the OUT#1 and OUT#2 are outside the pre-determined range but the value of the parameter at the OUT#1 is within the first pre-set range and the value of the parameter at the OUT#2 is within the second pre-set range.

In various embodiments, the parameter probe 408D measures a first amount of power at the OUT#4, the parameter probe 408C measures a second amount of power at the OUT#3, the parameter probe 408B measures a third amount of power at the OUT#2, and the parameter probe 408A measures a fourth amount of power at the OUT#1. The first amount is greater than the second amount, which is greater than the third amount. The third amount is greater than the fourth amount. The measured amounts of power are provided from the parameter probes 408A through 408D to the probe control and system control 110. The probe control and system control 110 determines to achieve the amounts of the power at the OUT#1 through OUT#4 within the pre-determined range from each other. The probe control and system control 110 sends a control signal to the motor M5 to decrease a capacitance of the capacitor C17 to increase an amount of power from the capacitor C17 to the output O1 to further increase the fourth amount of power of the combined RF signal at the OUT#1 so that the fourth amount of power is within the pre-determined range from the first amount of power at the OUT#4.

In some embodiments, instead of or in addition to the parameter probes 408A through 408D, which provide in line measurements of the parameter, one or more of capacitances of corresponding one or more of the capacitors C5, C6, C7, C8, C17, C19, C22, and C24 are modified in a manner described above based on wafer measurements, e.g., measurements obtained using wafer measurement devices, etc.

Examples of the wafer measurements include etch rates and deposition rates. The etch rate or deposition rate is referred to herein as a process rate. Examples of a wafer measurement device include an etch rate measurement device, a deposition rate measurement device, etc. To illustrate, the wafer measurement devices, e.g., four wafer measurement devices, etc., are coupled to the processor of the probe control and system control 110 via corresponding transfer cables and has a line of sight into the corresponding stations 1 through 4. The line of sight is directed into a space in which plasma is generated within the corresponding stations 1 through 4. For example, the wafer measurement device includes a spectrophotometer that monitors plasma within the station 1 to measure intensity of radiation emitted by the plasma. The intensity is directly proportional to an etch rate or a deposition rate of a layer of the wafer 101 that is processed by the plasma of the station 1. The processor of the probe control and system control 110 receives the measured intensity via the transfer cable to determine the process rate as directly proportional to the intensity. As another example, for a known recipe, the wafer measurement device measures a thickness of the wafer 101 at a time tm1 before or during processing, e.g., etching, depositing materials on, etc., of the wafer 101 and measures a thickness of the wafer 101 at a time tm2 after the processing of the wafer 101. The wafer measurement device determines the process rate of the wafer 101 as a ratio of a difference between the thickness at the time tm2 and the thickness at the time tail over a difference between the times tm2 and tm1. The process rate is provided by the wafer measurement device via the transfer cable to the processor of the probe control and system control 110. In some embodiments, instead of the wafer measurement device determining the process rate, the processor of the probe control and system control 110 determines the process rate from the measured intensity and provides the process rate to the memory device for storage. In these embodiments, the etch rate and the deposition rate are examples of an additional parameter. In these embodiments, the processor determines whether the process rate matches or is within a pre-defined range from a pre-determined process rate. Upon determining that the process rate is not within the pre-defined range, the processor determines to modify one or more of capacitances of corresponding one of more of the capacitors C5, C6, C7, C8, C17, C19, C22, and C24 so that the process rate is within the pre-defined range from the pre-determined process rate. A correspondence between the pre-determined process rate and one or more of capacitances of corresponding one of more of the capacitors C5, C6, C7, C8, C17, C19, C22, and C24 is stored in the memory device. In this manner, one or more of capacitances of corresponding one of more of the capacitors C5, C6, C7, C8, C17, C19, C22, and C24 are modified to achieve the pre-determined process rate associated with one or more of the stations 1 through 4.

In several embodiments, instead of or in addition to sensing the parameter at the outputs OUT#1, OUT#2, OUT#3, and OUT#4, position sensors are used to determine positions, e.g., distances between plates, angles between the plates, etc., of the capacitors C5, C6, C7, C8, C17, C19, C22, and C24 to control the positions so that the values of the parameter at the OUT#1, OUT#2, OUT#3, and OUT#4 are minimized Examples of the position sensors include linear sensors and rotational sensors. To illustrate, the position sensors include potentiometers or inductive position sensors or rotary encoders. Each position sensor is place in proximity to corresponding ones of the capacitors C5, C6, C7, C8, C17, C19, C22, and C24 to measure a position of the capacitor. The position is provided from the position sensor via a transfer cable to the processor of the probe control and system control 10. The probe control and system control 10 determines whether the position corresponds to the pre-determined process parameter. Upon determining that the position does not correspond to the pre-determined process parameter, the processor changes a position of the capacitor in a manner described above so that the position corresponds to, e.g., has a one-to-one relationship with, maps with, etc., the pre-determined process parameter. The correspondence between the position of the capacitor and the pre-determined process parameter is stored in the memory device. In this manner, positions of one or more of the capacitors C5, C6, C7, C8, C17, C19, C22, and C24 are monitored and controlled to achieve the pre-determined process parameter that corresponds to the positions of the one or more of the capacitors C5, C6, C7, C8, C17, C19, C22, and C24.

Figure 7:
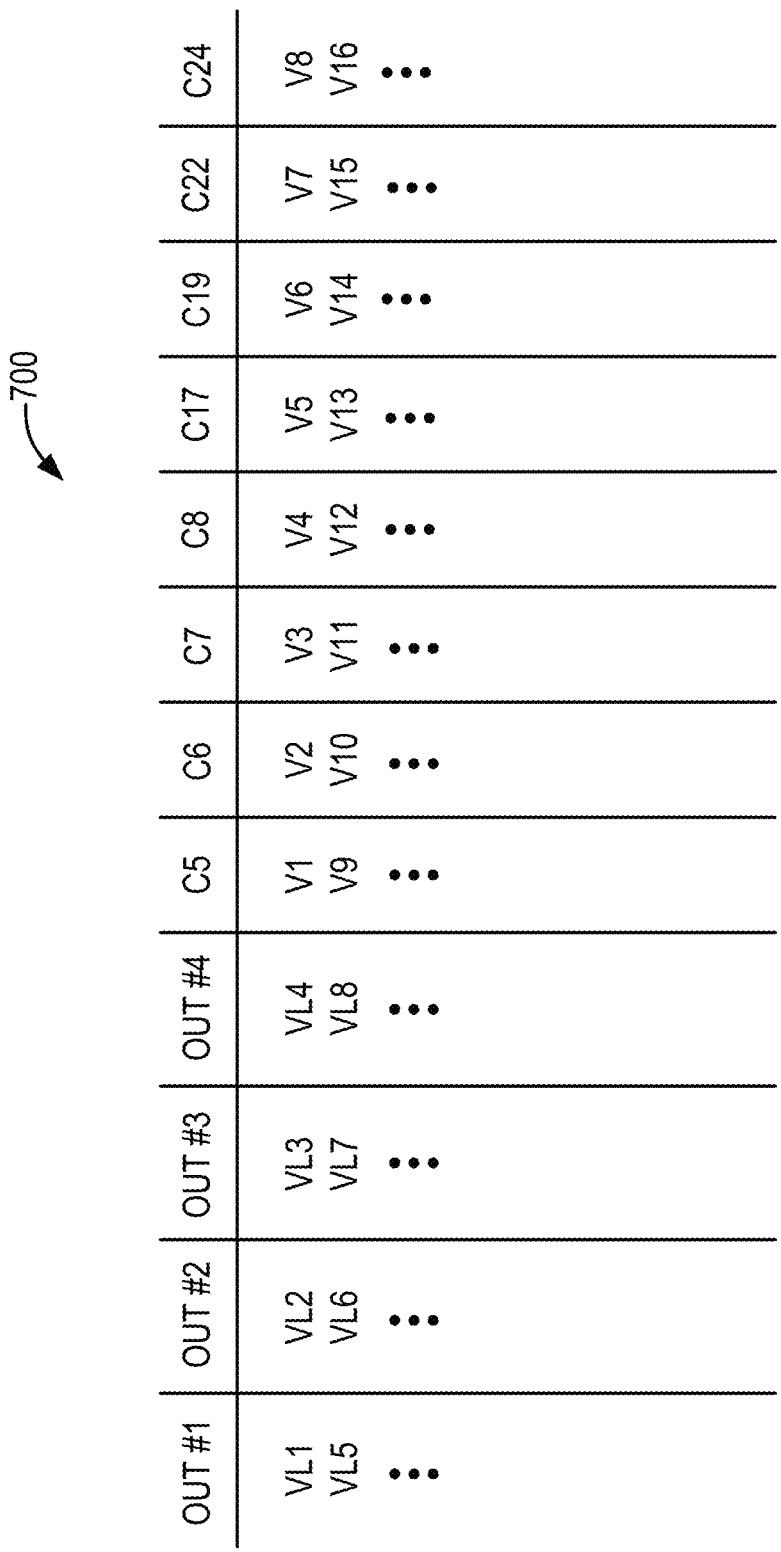
FIG. 7 is a diagram of an embodiment to illustrate a table listing, which is an example of a correspondence between values of a parameter at outputs of the combiner and distributor, and values of a variable of the tuning elements of the combiner and distributor so that the values of the parameter at the outputs are within a pre-determined range from each other.

FIG. 7 is a diagram of an embodiment to illustrate a table listing 700, which is an example of the correspondence between values of the parameter at the outputs OUT#1, OUT#2, OUT#3, and OUT#4, and values of the variable of the tuning elements of the combiner and distributor 121 so that the values of the parameter at the outputs OUT#1, OUT#2, OUT#3, and OUT#4 are within the pre-determined range from each other. The table listing 700 is stored in the memory device of the combiner and distributor 121. The table listing 700 includes rows of values of the parameter at the outputs OUT#1 through OUT#4, and values of the variables of the capacitors C5, C6, C7, C8, C17, C19, C22, and C24 of the combiner and distributor 121.

A first row of the table listing 700 is a correspondence among a value VL1 of the parameter at the OUT#1, a value VL2 of the parameter at the OUT#2, a value VL3 of the parameter at the OUT#3, a value VL4 of the parameter at the OUT#4, a value V1 of the capacitance of the capacitor C5, a value V2 of the capacitance of the capacitor C6, a value V3 of the capacitance of the capacitor C7, a value V4 of the capacitance of the capacitor C8, a value V5 of the capacitance of the capacitor C17, a value V6 of the capacitance of the capacitor C19, a value V7 of the capacitance of the capacitor C22, and a value V8 of the capacitance of the capacitor C24. For example, when the value of the parameter at the OUT#1 is measured to be VL1 and the value of the parameter at the OUT#2 is other than VL2, to achieve the value VL2 at the OUT#2, the value of the capacitance of the capacitor C5 is changed to be V1, and/or the value of the capacitance of the capacitor C6 is changed to be V2, and/or the value of the capacitance of the capacitor C17 is changed to be V5, and/or the value of the capacitance of the capacitor C19 is changed to be V6. The values VL1 and VL2 are within the pre-determined range from each other. Similarly, a second row of the table listing 700 is a correspondence among a value VL5 of the parameter at the OUT#1, a value VL6 of the parameter at the OUT#2, a value VL7 of the parameter at the OUT#3, a value VL8 of the parameter at the OUT#4, a value V9 of the capacitance of the capacitor C5, a value V10 of the capacitance of the capacitor C6, a value V11 of the capacitance of the capacitor C7, a value V12 of the capacitance of the capacitor C8, a value V13 of the capacitance of the capacitor C17, a value V14 of the capacitance of the capacitor C19, a value V15 of the capacitance of the capacitor C22, and a value V16 of the capacitance of the capacitor C24.

Figure 8A:
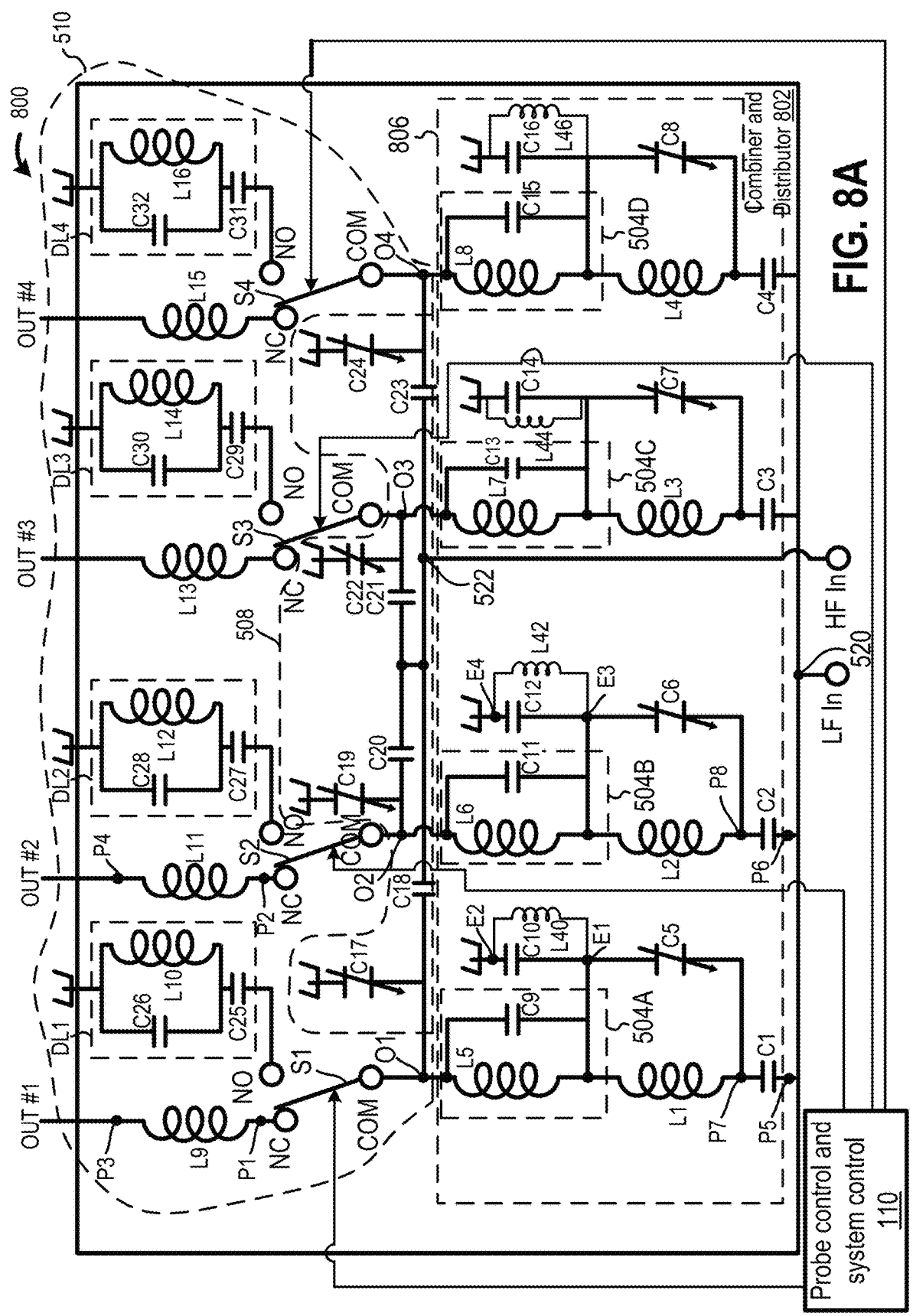
FIG. 8A is a circuit diagram of an embodiment of a system to illustrate a control of wafer bow by using a shunt inductor for each of the four processing stations.

FIG. 8A is a circuit diagram of an embodiment of a system 800 to illustrate passive method of controlling wafer bow by using a shunt inductor for each of the stations 1 through 4. The system 800 includes a combiner and distributor 802, which is used in place of the combiner and distributor 121 (FIG. 5). The combiner and distributor 802 is the same as the combiner and distributor 121 except that the combiner and distributor 802 includes a low frequency circuit 806. The low frequency circuit 806 is the same as, e.g., is the same in structure and function as, the low frequency circuit 506 except that the low frequency circuit 806 includes multiple shunt inductors L40, L42, L44, and L46. The shunt inductor L40 is coupled in parallel with the capacitor C10, the shunt inductor L42 is coupled in parallel with the capacitor C12, the shunt inductor L44 is coupled in parallel with the capacitor C14, and the shunt inductor L46 is coupled in parallel with the capacitor C16.

In one embodiment, each shunt inductor L40, L42, L44, and L46 is fixed, e.g., has a fixed value during processing of, such as depositing films on, the wafer 101 in a corresponding station. For example, the shunt inductor L40 has a fixed value during processing of the wafer 101 in the station 1 and the shunt inductor L42 has a fixed value during processing of the wafer 101 in the station 2. A value of each shunt inductor L40, L42, L44, and L46 is changed by manually by a user by replacing the shunt inductor with another shunt inductor before or after processing of the wafer 101.

Moreover, the shunt inductor L40 is connected to the high frequency blocking circuit 504A and to a ground potential. For example, the end E1 of the shunt inductor L40 is connected to the inductor L5 and to the capacitor C9 of the high frequency blocking circuit 504A and the opposite end E2 of the shunt inductor L40 is connected to the ground potential. Similarly, the shunt inductor L42 is connected to the high frequency blocking circuit 504B and to a ground potential, the shunt inductor L44 is connected to the high frequency blocking circuit 504C and to a ground potential, and the shunt inductor L46 is connected to the high frequency blocking circuit 504D and to a ground potential. For example, the end E3 of the shunt inductor L42 is connected to the inductor L6 and to the capacitor C11 of the high frequency blocking circuit 504B and the end E4 of the shunt inductor L42 is connected to the ground potential.

Also, the shunt inductor L40 is coupled via the high frequency blocking circuit 504A, the switch S1 in the normally closed position, the inductor L9, the OUT#1, and the coaxial cable 416A to the station 1. Similarly, the shunt inductor L42 is coupled via the high frequency blocking circuit 504B, the switch S2 in the normally closed position, the inductor L11, the OUT#2, and the coaxial cable 416B to the station 2. Furthermore, the shunt inductor L44 is coupled via the high frequency blocking circuit 504C, the switch S3 in the normally closed position, the inductor L13, the OUT#3, and the coaxial cable 416C to the station 3. Also, the shunt inductor L46 is coupled via the high frequency blocking circuit 504D, the switch S4 in the normally closed position, the inductor L15, the OUT#4, and the coaxial cable 416D to the station 4.

Furthermore, the shunt inductor L40 is coupled via the switch S1 in the normally open position to the dummy load DL1. For example, the shunt inductor L40 is connected via the switch S1 in the normally open position to the capacitor C25 of the dummy load DL1. Similarly, the shunt inductor L42 is coupled via the switch S2 in the normally open position to the dummy load DL2, the shunt inductor L44 is coupled via the switch S3 in the normally open position to the dummy load DL3, and the shunt inductor L46 is coupled via the switch S4 in the normally open position to the dummy load DL4. For example, the shunt inductor L42 is connected via the switch S2 in the normally open position to the capacitor C27 of the dummy load DL2.

The shunt inductor L40 is connected via the end E1 to the capacitor C5. Similarly, the shunt inductor L42 is connected via the end E2 to the capacitor C11. Also, the shunt inductor L44 is connected to the capacitor C7 and the shunt inductor L44 is connected to the capacitor C8.

Furthermore, the shunt inductor L40 is coupled via the end E1, the capacitor C5, and the capacitor C1 to the input 520. Similarly, the shunt inductor L42 is coupled via the end E3, the capacitor C6, and the capacitor C2 to the input 520. Also, the shunt inductor L44 is coupled via the capacitor C7 and the capacitor C3 to the input 520, and the shunt inductor L46 is coupled via the capacitor C8 and the capacitor C4 to the input 520.

The coupling of the shunt inductor L40 via the high frequency blocking circuit 504A, the switch S1 in the normally closed position, the inductor L9, the OUT#1, and the coaxial cable 416A to the station 1 allows the shunt inductor L40 to control an amount of current that is supplied to the station 1. For example, an inductance of the shunt inductor L40 is changed to increase the amount of current supplied to the station 1 via the high frequency blocking circuit 504A, the switch S1 in the normally closed position, the inductor L9, the OUT#1, and the coaxial cable 416A. As another example, when an inductance of the shunt inductor L40 is changed, an amount of current that flows from the shunt inductor L40 via the end E1, the high frequency blocking circuit 504A, the output O1, the switch S1 in the normally closed position, the inductor L9, the OUT#1, and the coaxial cable 416A to the station 1 changes, such as increases or decreases.

The increase in the amount of current increases an amount of ions that impinge on a surface of the wafer 101 being processed in the station 1 to reduce the wafer bow. For example, when the shunt inductor L40 is coupled via the high frequency blocking circuit 504A, the switch S1 in the normally closed position, the inductor L9, the OUT#1, and the coaxial cable 416A to the showerhead 150 of the station 1, an inductance of the shunt inductor L40 is changed to increase the amount of current to the showerhead 150 of the station 1. The current to the showerhead 150 is increased when the coaxial cable 416A is coupled to the showerhead 150 and the pedestal 140 is coupled to a ground potential or to another potential. The increase in the amount of current to the showerhead 150 increases an amount of positive ions of plasma between the showerhead 150 and the pedestal 140 to reduce a concave wafer bow of the wafer 101 being processed in the station 1. As another example, when the shunt inductor L40 is coupled via the high frequency blocking circuit 504A, the switch S1 in the normally closed position, the inductor L9, the OUT#1, and the coaxial cable 416A to the pedestal 140 of the station 1, an inductance of the shunt inductor L40 is changed to increase the amount of current to the pedestal 140 of the station 1. The current to the pedestal 140 is increased when the coaxial cable 416A is coupled to the pedestal 140 and the showerhead 150 is coupled to a ground potential or to another potential. The increase in the amount of current to the pedestal 140 increases an amount of positive ions of plasma between the showerhead 150 and the pedestal 140 to reduce a convex wafer bow of the wafer 101 being processed in the station 1.

Similarly, the coupling of the shunt inductor L42 via the high frequency blocking circuit 504B, the switch S2 in the normally closed position, the inductor L11, the OUT#2, and the coaxial cable 416B to the station 2 allows the shunt inductor L42 to control an amount of current that is supplied to the station 2. For example, an inductance of the shunt inductor L42 is changed to increase the amount of current supplied to the station 2 via the high frequency blocking circuit 504B, the switch S2 in the normally closed position, the inductor L11, the OUT#2, and the coaxial cable 416B. As another example, when an inductance of the shunt inductor L42 is changed, an amount of current that flows from the shunt inductor L42 via the end E3, the high frequency blocking circuit 504C, the output O2, the switch S2 in the normally closed position, the inductor L11, the OUT#2, and the coaxial cable 416B to the station 2 changes, such as increases or decreases.

The increase in the amount of current increases an amount of ions that impinge on a surface of the wafer 101 being processed in the station 2 to reduce the wafer bow. For example, when the shunt inductor L42 is coupled via the high frequency blocking circuit 504B, the switch S2 in the normally closed position, the inductor L11, the OUT#2, and the coaxial cable 416B to the showerhead 150 of the station 2, an inductance of the shunt inductor L42 is changed to increase the amount of current to the showerhead 150 of the station 2. The current to the showerhead 150 is increased when the coaxial cable 416B is coupled to the showerhead 150 and the pedestal 140 is coupled to a ground potential or to another potential. The increase in the amount of current to the showerhead 150 increases an amount of positive ions of plasma traveling from the showerhead 150 to the pedestal 140 to reduce a concave wafer bow of the wafer 101 being processed in the station 2. As another example, when the shunt inductor L42 is coupled via the high frequency blocking circuit 504B, the switch S2 in the normally closed position, the inductor L11, the OUT#2, and the coaxial cable 416B to the pedestal 140 of the station 2, an inductance of the shunt inductor L42 is changed to increase the amount of current to the pedestal 140 of the station 2. The current to the pedestal 140 is increased when the coaxial cable 416B is coupled to the pedestal 140 and the showerhead 150 is coupled to a ground potential or to another potential. The increase in the amount of current to the pedestal 140 increases an amount of positive ions of plasma traveling from the showerhead 150 to the pedestal 140 to reduce a convex wafer bow of the wafer 101 being processed in the station 2.

Moreover, similarly, the coupling of the shunt inductor L44 via the high frequency blocking circuit 504C, the switch S3 in the normally closed position, the inductor L13, the OUT#3, and the coaxial cable 416C to the station 3 allows the shunt inductor L44 to control an amount of current that is supplied to the station 3. Similarly, the coupling of the shunt inductor L46 via the high frequency blocking circuit 504D, the switch S4 in the normally closed position, the inductor L15, the OUT#4, and the coaxial cable 416D to the station 4 allows the shunt inductor L46 to control an amount of current that is supplied to the station 4.

A passive element, e.g., the shunt inductor L40 or L42 or L44 or L46, etc., is implemented within the combiner and distributor 802. The combiner and distributor 802 powers two or more of the stations 1 through 4 located in a single or multiple chambers. By increasing an amount of ions between the showerhead 150 and the pedestal 140, each shunt inductor L40, L42, L44, and L46 changes a response of a total impedance of a corresponding one of the stations 1 through 4 to wafer bow in a way that power supplied to the station is not affected by bowing of the wafer 101. For example, an inductance of the shunt inductor L40 is modified to change a response of a total impedance of the station 1, an inductance of the shunt inductor L42 is modified to change a response of a total impedance of the station 2, an inductance of the shunt inductor L44 is modified to change a response of a total impedance of the station 3, and an inductance of the shunt inductor L46 is modified to change a response of a total impedance of the station 4. In some embodiments, the combiner and distributor 802 reduces chances of a run-away situation when initial bow leads to lower RF power and then to an even stronger bow. As another example, a parameter probe, further described below, is coupled at the output OUT#1 or to an input of the station 1 to measure a parameter during processing of the wafer 101 for a first time. The measured parameter is read by the user and a value of the shunt inductor L40 is modified by the user manually after the processing of the wafer 101 to increase an amount of current to the station 1. Again, during processing of the wafer 101 for a second time, the parameter probe measures the parameter. The second time is after the first time. After the processing for the second time, a value of the inductor L40 is changed by the user manually. This process of measuring the parameter and changing the inductance of the inductor L40 is repeated until the inductance is within a pre-determined limit from a pre-determined value of the parameter. As such, there is passive control of the inductor L40 to achieve the pre-determined value of the parameter. Similarly, inductances of the inductors L42, L44, and L46 are modified manually until their corresponding inductances are within corresponding pre-determined limits from corresponding pre-determined values of the parameter.

In an embodiment, a pre-determined limit from a pre-determined value of the parameter for one station is different from a pre-determined limit from a pre-determined value of the parameter for another station. In one embodiment, a pre-determined limit from a pre-determined value of the parameter for one station is the same as the pre-determined limit from a pre-determined value of the parameter for another station. In an embodiment, a pre-determined value of the parameter for one station is different from a pre-determined value of the parameter for another station. In one embodiment, a pre-determined value of the parameter for one station is the same as a pre-determined value of the parameter for another station.

Figure 8B:
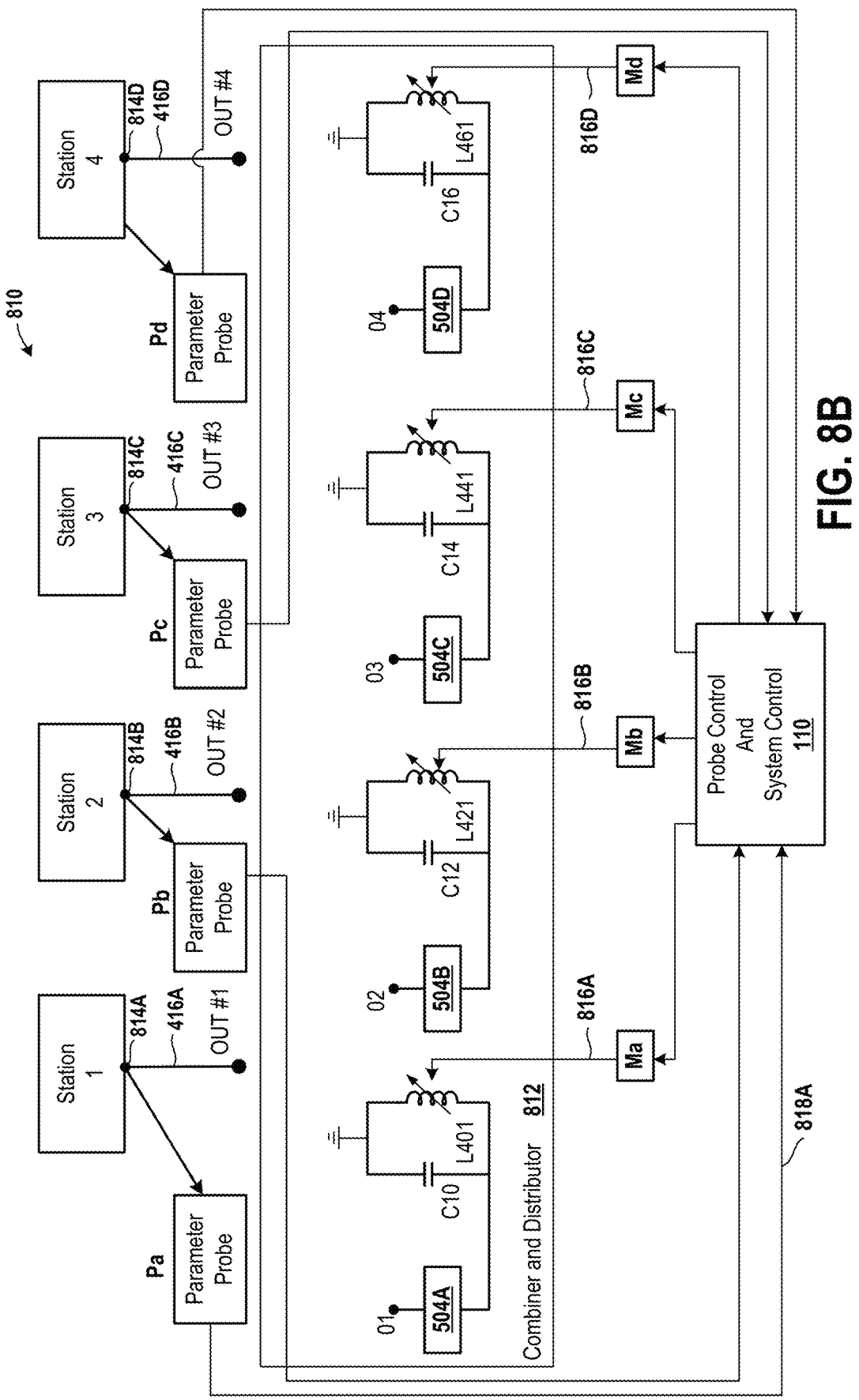
FIG. 8B is a diagram of an embodiment of a system to illustrate control of shunt inductors so that a change in power delivered to a station is substantially negligible.

FIG. 8B is a diagram of an embodiment of a system 810 to illustrate a control of variable shunt inductors L401, L421, L441, and L461 to achieve a change in delivered power that is substantially negligible, such as zero percent change in delivered power or within a pre-determined limit from zero percent change in delivered power. By controlling the variable shunt inductors L401, L421, L441, and L461, wafer bow of wafers 101 at the stations 1 through 4 is actively controlled. The system 810 includes the probe control and system control 110 and a combiner and distributor 812. The combiner and distributor 812 is the same as the combiner and distributor 802 except that the shunt inductor L40 is replaced with the shunt inductor L401, the shunt inductor L42 is replaced with a variable shunt inductor L421, the shunt inductor L44 is replaced with a variable shunt inductor L441, and the shunt inductor L46 is a replaced with a variable shunt inductor L461. For example, an inductance of one or more of the shunt inductors L401, L421, L441, and L461 is controlled by the probe control and system control 110 to be changed during processing of the wafer 101. To illustrate, an inductance of the shunt inductor L401 is controlled by the probe control and system control 110 to be increased or decreased during deposition of thin films on the wafer 101 in the station 1. As another illustration, an inductance of the shunt inductor L421 is controlled by the probe control and system control 110 to be increased or decreased during deposition of thin films on the wafer 101 in the station 2.

The system 810 further includes a parameter probe Pa that is coupled to an end 814A of the coaxial cable 416A and the end 814A is coupled to the OUT#1. The end 814A is located at the input of the station 1. Moreover, the system 810 includes a parameter probe Pb that is coupled to an end 814B of the coaxial cable 416B and the end 416B is coupled to the OUT#2. The end 814B is located at the input of the station 2. Also, the system 810 further includes a parameter probe Pc that is coupled to an end 814C of the coaxial cable 416C and the end 814C is coupled to the OUT#3. The end 814C is located at the input of the station 3. The system 810 further includes a parameter probe Pd that is coupled to an end 814D of the coaxial cable 416D and the end 814D is coupled to the OUT#4. The end 814D is located at the input of the station 4.

The end 416A is located at an input of the station 1. For example, the end 416A is connected to the pedestal 140 or the showerhead 150 of the station 1. Similarly, the end 416A is located at an input of the station 2, the end 416C is located at an input of the station 3, and the end 416D is located at an input of the station 4. For example, the end 416B is coupled to the showerhead 150 or the pedestal 140 of the station 2, the end 416C is coupled to the showerhead 150 or the pedestal 140 of the station 3, and the end 416C is coupled to the showerhead 150 or the pedestal 140 of the station 4.

An example of each of the parameter probes Pa through Pd includes a power sensor, such as a sensor that measures power delivered to a station. To illustrate, the parameter probe Pa measures power that is delivered from the OUT#1 via the coaxial cable 416A and the end 814A to the station 1. As another illustration, the parameter probe Pb measures power that is delivered from the OUT#2 via the coaxial cable 416B and the end 814B to the station 1. An example of power delivered to a station is a difference between power that is supplied via a coaxial cable to the station and power that is reflected via the coaxial cable from the station. Another example of each of the parameter probes Pa through Pd includes a power sensor that measures power supplied to a station and power that is reflected from the station.

The system 810 also includes multiple motors Ma, Mb, Mc, and Md. The motor Ma is coupled via a connection mechanism 816A to the shunt inductor L401. Similarly, the motor Mb is coupled via a connection mechanism 816B to the shunt inductor L421, the motor Mc is coupled via a connection mechanism 816C to the shunt inductor L441, and the motor Md is coupled via a connection mechanism 816D to the shunt inductor L461.

Each of the motors Ma, Mb, Mc, and Md is coupled to the probe control and system control 110. For example, the motor Ma is coupled to the processor of the probe control and system control 110 via a driver, such as one or more transistors, located within the probe control and system control 110. As another example, the motor Mb is coupled to the processor of the probe control and system control 110 via a driver, such as one or more transistors, located within the probe control and system control 110. The motor Mc is coupled to the processor of the probe control and system control 110 via a driver, such as one or more transistors, located within the probe control and system control 110. Similarly, the motor Md is coupled to the processor of the probe control and system control 110 via a driver, such as one or more transistors, located within the probe control and system control 110.

The power delivered at the end 814A to the station 1 is sent from the parameter probe Pa via a transfer cable 818A to the processor of the probe control and system control 110. The processor of the probe control and system control 110 receives the power delivered over a pre-set time period, which is stored in the memory device of the probe control and system control 110. The processor determines whether a change in the power delivered at the end 814A over the pre-determined time period is substantially negligible, such as, is within the pre-determined limit from zero percent change. To illustrate, the processor determines whether the change in the power delivered at the end 814A is less than the pre-determined limit, such as 1 percent, over the pre-determined time period. As another example, the processor determines whether the change in the power delivered in less than the pre-determined limit, such as 0.08%, over the pre-determined time period. As yet another example, the processor determines whether the change in the power delivered has a standard deviation of less than the pre-determined limit, such as a pre-determined percentage, over the pre-determined time period. The processor calculates the standard deviation from the power measured by the parameter probe Pa. The pre-determined percentage is stored in the memory device of the memory device.

Upon determining that the change in the power delivered at the end 814A to the station 1 is greater than the pre-determined limit from the zero percent change, the processor controls the shunt inductor L401 to change an inductance of the shunt inductor L401. For example, the processor sends a signal to the motor Ma to change a position of a core of the shunt inductor L401 to change a position of the core with respect to windings of the shunt inductor L401 to modify an inductance of the shunt inductor L401. The processor controls the shunt inductor L401 to change the inductance of the shunt inductor L401 until the change in the power delivered at the end 814A to the station 1 is substantially negligible, such as is less than the pre-determined limit from the zero percent change. When the change in the power delivered to the station 1 is substantially negligible, a wafer bow of the wafer 101 of the wafer 101 is reduced.

Similarly, based on delivered power that is measured by the parameter probe Pb over the pre-determined time period, the probe control and system control 110 controls the shunt inductor L421 so that a change in power delivered to the station 2 at the end 416B is substantially negligible. Moreover, based on delivered power that is measured by the parameter probe Pc over the pre-determined time period, the probe control and system control 110 controls the shunt inductor L441 so that a change in power delivered to the station 3 at the end 416C is substantially negligible. Also, based on delivered power that is measured by the parameter probe Pd over the pre-determined time period, the probe control and system control 110 controls the shunt inductor L461 so that a change in power delivered to the station 4 at the end 416C is substantially negligible.

In the embodiment in which the shunt inductors L40, L42, L44, and L46 are used instead of the variable shunt inductors L401, L421, L441, and L461, the shunt inductor 40 is replaced with another fixed shunt inductor manually until a change in power delivered at the end 814A as measured by the parameter probe Pa is determined to be substantially negligible by the processor of the probe control and system control 110. Moreover, the shunt inductor 42 is replaced with another fixed shunt inductor manually until a change in power delivered at the end 814B as measured by the parameter probe Pb is determined to be substantially negligible by the processor of the probe control and system control 110. Similarly, the shunt inductor 44 is replaced with another fixed shunt inductor manually until a change in power delivered at the end 814C as measured by the parameter probe Pc is determined to be substantially negligible by the processor of the probe control and system control 110. Also, the shunt inductor 46 is replaced with another fixed shunt inductor manually until a change in power delivered at the end 814D as measured by the parameter probe Pd is determined to be substantially negligible by the processor of the probe control and system control 110.

In one embodiment, instead of measuring power delivered at the ends 416A through 416D, power delivered is measured at the outputs OUT#1 through OUT#4.

In an embodiment, instead of measuring power delivered at the outputs OUT#1 through OUT#4 or at the ends 416A through 416D, delivered power is measured at any point on the coaxial cables 416A through 416D.

In one embodiment, instead of delivered power being measured and sent from a parameter probe to the probe control and system control 110, power supplied and power reflected is measured and sent from a parameter probe to the processor of the probe control and system control 110. The processor of the probe control and system control 110 calculates a difference between the power supplied to a station and power reflected from the station to calculate power delivered to the station.

Figure 9A:
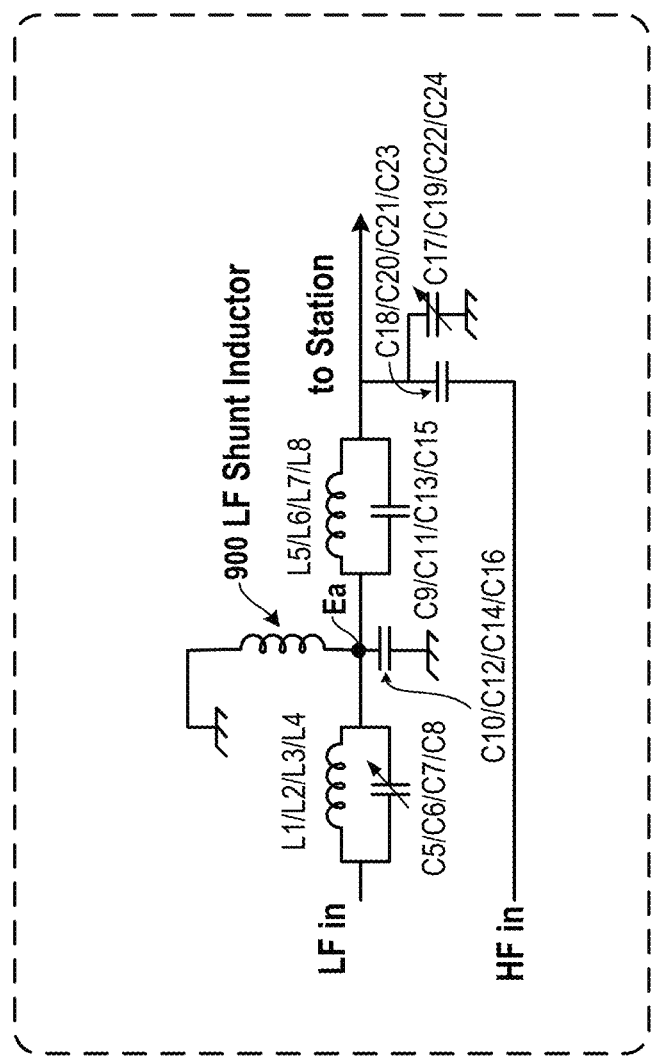
FIG. 9A is a circuit diagram of an embodiment of a low frequency circuit of a power combiner and distributor to illustrate that the shunt inductor is coupled between a low frequency circuit portion that includes a tuning circuit and an inductor and another low frequency circuit portion that includes a high frequency blocking circuit and a capacitor.

FIG. 9A is a circuit diagram of an embodiment of a shunt inductor 900 to illustrate that the shunt inductor 900 is located between a low frequency circuit portion that includes a tuning circuit and an inductor and another low frequency circuit portion that includes a high frequency blocking circuit and a capacitor. The low frequency circuit portions are parts of the low frequency circuit 806 of FIG. 8A. The shunt inductor L40, or L42, or L44, or L46 is an example of the shunt inductor 900 when the shunt inductor 900 is fixed. Similarly, the shunt inductor L401, or L421, or L441, or L461 is an example of the shunt inductor 900 when the shunt inductor 900 is variable. An end of the shunt inductor 900 is coupled to a ground connection. Another end of the shunt inductor 900 is coupled to an end Ea located between the low frequency circuit portion that includes the tuning circuit and the inductor and another low frequency circuit portion that includes the high frequency blocking circuit and the capacitor. For example, the shunt inductor L40 is coupled to the end E1 (FIG. 8A) located between a low frequency circuit portion that includes the capacitor C5 and the inductor L1 and another low frequency circuit portion that includes the high frequency blocking circuit 504A and the capacitor C10. As another example, the shunt inductor L42 is coupled to the end E3 (FIG. 8A) located between a low frequency circuit portion that includes the capacitor C6 and the inductor L2 and another low frequency circuit portion that includes the high frequency blocking circuit 504B and the capacitor C12. As yet another example, the shunt inductor L44 is coupled to the end Ea located between a low frequency circuit portion that includes the capacitor C7 and the inductor L3 and another low frequency circuit portion that includes the high frequency blocking circuit 504C and the capacitor C14. As still another example, the shunt inductor L46 is coupled to the end Ea located between a low frequency circuit portion that includes the capacitor C8 and the inductor L4 and another low frequency circuit portion that includes the high frequency blocking circuit 504D and the capacitor C16.

Figure 9B:
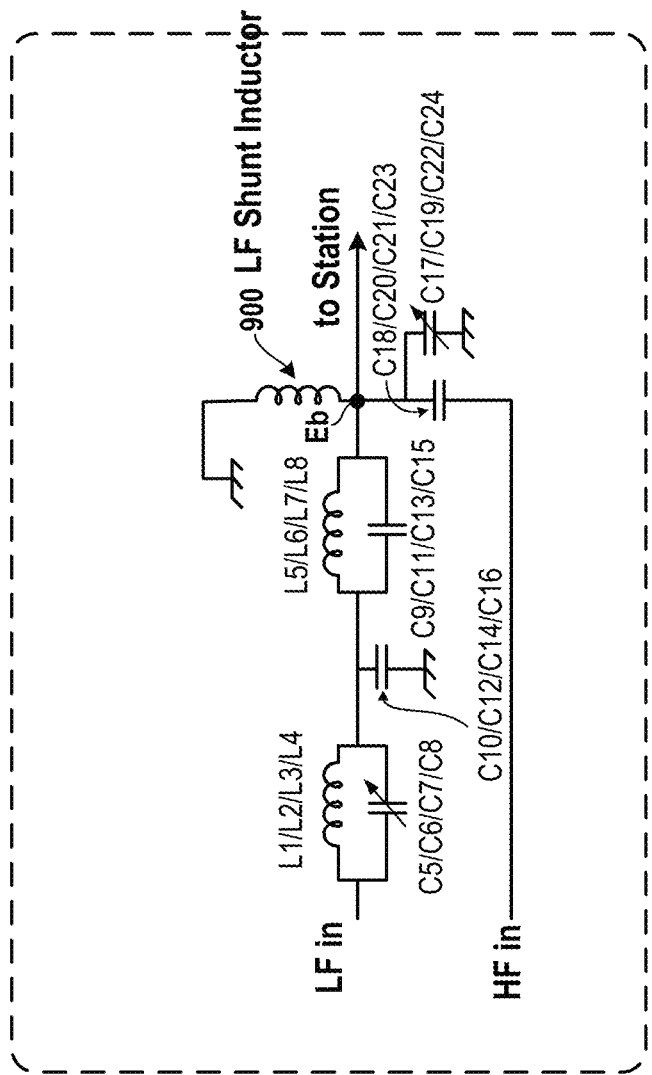
FIG. 9B is a circuit diagram of an embodiment of a low frequency circuit of a power combiner and distributor to illustrate that the shunt inductor is coupled between the high frequency blocking circuit and one of the processing stations.

FIG. 9B is a circuit diagram of an embodiment of a shunt inductor 900 to illustrate that the shunt inductor 900 is coupled between a high frequency blocking circuit of the low frequency circuit 506 and one of the plasma processing stations 1 through 4. For example, the shunt inductor L40 is coupled between the high frequency blocking circuit 504A of the combiner and distributor 121 and the switch S1. An end of the shunt inductor L40 is coupled to a ground connection and another end of the shunt inductor 900 is coupled to an end Eb at a point between the high frequency blocking circuit 504A and the switch S1 that is connected to the high frequency blocking circuit 504A. As another example, the shunt inductor L42 is coupled to the end Eb, such as the output O2, located between the high frequency blocking circuit 504B and the switch S2. As yet another example, the shunt inductor L44 is coupled to the end Eb, such as the output O3, located between the high frequency blocking circuit 504C and the switch S3. As still another example, the shunt inductor L46 is coupled to the end Eb, such as the output O4, located between the high frequency blocking circuit 504D and the switch S4.

As another example, the shunt inductor 900 is coupled between a switch of the output portion 510 and an inductor of the output portion 510. To further illustrate, the shunt inductor L40 is connected to the end Eb, such as a point P1 (FIG. 8A), between the switch S1 and the inductor L9. As another illustration, the shunt inductor L42 is connected to the end Eb, such as a point P2, between the switch S2 and the inductor L11. As yet another illustration, the shunt inductor L44 is connected to the end Eb, such as a point, between the switch S3 and the inductor L13. As another illustration, the shunt inductor L46 is connected to the end Eb, such as a point, between the switch S4 and the inductor L15.

As yet another example, the shunt inductor 900 is coupled between the output portion 510 and one of the plasma processing stations 1 through 4. To further illustrate, the shunt inductor L40 is connected to the end Eb, such as a point, on the coaxial cable 416A between the output OUT#1 and the plasma processing station 1. As another illustration, the shunt inductor L42 is connected to the end Eb, such as a point on the coaxial cable 416B between the output OUT#2 and the plasma processing station 2. As yet another illustration, the shunt inductor L44 is connected to the end Eb, such as a point, on the coaxial cable 416C between the output OUT#3 and the plasma processing station 3. As another illustration, the shunt inductor L46 is connected to the end Eb, such as a point, on the coaxial cable 416D between the output OUT#4 and the plasma processing station 4.

As another example, the shunt inductor 900 is coupled between one of balancing inductors L9, L11, L13, and L15 and one of the outputs OUT#1 through OUT#4 that is coupled to the balancing inductor. To further illustrate, the shunt inductor L40 is coupled to the end Eb, such as a point P3, between the inductor L9 and the output OUT#1 of the combiner and distributor 121. As another illustration, the shunt inductor L42 is coupled to the end Eb, such as a point P4, between the inductor L11 and the output OUT#2 of the combiner and distributor 121. As yet another illustration, the shunt inductor L44 is coupled to the end Eb, such as a point, between the inductor L13 and the output OUT#3 of the combiner and distributor 121. As another illustration, the shunt inductor L46 is coupled to the end Eb, such as a point, between the inductor L15 and the output OUT#4 of the combiner and distributor 121.

It should be noted that the shunt inductor 900 is coupled to the end Eb instead of the end Ea.

Figure 9C:
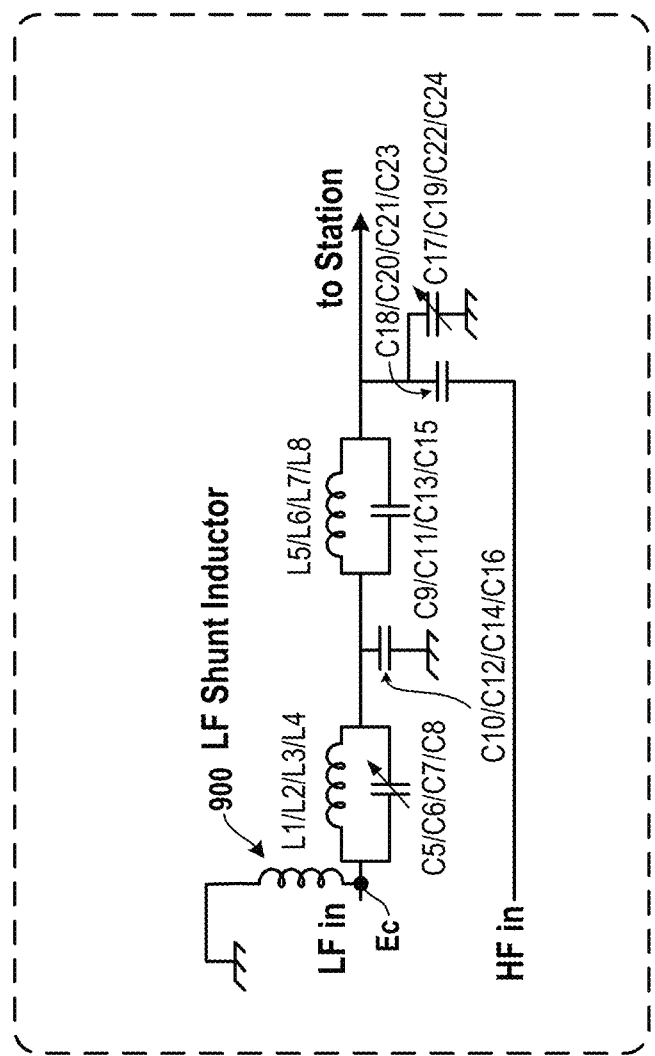
FIG. 9C is a circuit diagram of an embodiment of a low frequency circuit of a power combiner and distributor to illustrate that the shunt inductor is coupled between an input of the low frequency circuit and a low frequency circuit portion that includes a tuning circuit and an inductor of the low frequency circuit.

FIG. 9C is a circuit diagram of an embodiment of a shunt inductor 900 to illustrate that the shunt inductor 900 is coupled between the input 520 of the low frequency circuit 520 and a low frequency circuit portion that includes a tuning circuit and an inductor. The low frequency circuit portion is of the low frequency circuit 506. For example, an end of the shunt inductor 900 is coupled to a ground connection and another end of the shunt inductor 900 is coupled to an end Ec located between the input 520 of the low frequency circuit 520 and one of the DC blocking capacitors C1 through C4. To further illustrate, the shunt inductor L40 is connected to the end Ec, such as a point P5, between the capacitor C1 and the input 520 (FIG. 8A) of the low frequency circuit 520. As another illustration, the shunt inductor L42 is connected to the end Ec, such as a point P6 (FIG. 8A), between the capacitor C2 and the input 520 of the low frequency circuit 520. As yet another illustration, the shunt inductor L44 is connected to the end Ec, such as a point, between the capacitor C3 and the input 520 of the low frequency circuit 520. As another illustration, the shunt inductor L46 is connected to the end Ec, such as a point, between the capacitor C4 and the input 520 of the low frequency circuit 520.

As another example, an end of the shunt inductor 900 is coupled to a ground connection and another end of the shunt inductor 900 is coupled to the end Ec located between one of the DC blocking capacitors C1 through C4 and one of the inductors L1 through L4 that is coupled to the DC blocking capacitor. To further illustrate, the shunt inductor L40 is connected to the end Ec, such as a point P7, between the capacitor C1 and the inductor L1. As another illustration, the shunt inductor L42 is connected to the end Ec, such as a point P8 (FIG. 8A), between the capacitor C2 and the inductor L2. As yet another illustration, the shunt inductor L44 is connected to the end Ec, such as a point, between the capacitor C3 and the inductor L3. As another illustration, the shunt inductor L46 is connected to the end Ec, such as a point, between the capacitor C4 and the inductor L4.

It should be noted that in an embodiment, the method described above with reference to FIG. 8A for passively controlling the shunt inductors L40, L42, L44, and L46 is equally applicable to the shunt inductor 900 regardless of a location of coupling of the shunt inductor 900 between the input 520 of the low frequency circuit 506 and an input of one of the stations 1 through 4. For example, a value of the shunt inductor 900 is manually changed by the user after processing of the wafer 101 at the station 1 until a value of the parameter measured by the parameter probe Pa at the end 814A of the coaxial cable 416A is within a pre-determined limit from a pre-determined value of the parameter. As another example, a value of the shunt inductor 900 is manually changed by the user after processing of the wafer 101 at the station 2 until a value of the parameter measured by the parameter probe Pb at the end 814B of the coaxial cable 416B is within a pre-determined limit from a pre-determined value of the parameter.

It should further be noted that in an embodiment, the method described above with reference to FIG. 8B for actively controlling the shunt inductors L401, L421, L441, and L461 is equally applicable to the shunt inductor 900 regardless of a location of coupling of the shunt inductor 900 between the input 520 of the low frequency circuit 506 and an input of one of the stations 1 through 4. For example, a value of the shunt inductor 900 is changed using the motor Ma after processing of the wafer 101 at the station 1 until a value of the parameter measured by the parameter probe P1 at the end 814A of the coaxial cable 416A is within a pre-determined limit from a pre-determined value of the parameter. In this example, the shunt inductor L900 is coupled between the input 520 of the low frequency circuit 506 and the end 814A of the coaxial cable 416A. As another example, a value of the shunt inductor 900 is changed using the motor Mb after processing of the wafer 101 at the station 2 until a value of the parameter measured by the parameter probe P2 at the end 814B of the coaxial cable 416B is within a pre-determined limit from a pre-determined value of the parameter. In this example, the shunt inductor L900 is coupled between the input 520 of the low frequency circuit 506 and the end 814B of the coaxial cable 416B.

It should be noted that the shunt inductor 900 is coupled to the end Ec instead of the end Ea or Eb.

It should further be noted that in one embodiment, the shunt inductor 900 is coupled in parallel to a station. For example, the shunt inductor L40 is coupled in parallel to the station 1, the shunt inductor L42 is coupled in parallel to the station 2, the shunt inductor L44 is coupled in parallel to the station 3, and the shunt inductor L46 is coupled in parallel to the station 4. To illustrate, an end of the shunt inductor L40 is coupled to the coaxial cable 416A and another end of the shunt inductor L40 is coupled to a ground connection. Similarly, one end, such as the pedestal 140 or the showerhead 150, of the station 1 is coupled to the coaxial cable 416A and an opposite end, such as the showerhead 150 or the pedestal 140, of the station 1 is coupled to a ground connection. The pedestal 140 is located at an opposite end of the station 1 compared to the showerhead 150. As another example, the shunt inductor L401 is coupled in parallel to the station 1, the shunt inductor L421 is coupled in parallel to the station 2, the shunt inductor L441 is coupled in parallel to the station 3, and the shunt inductor L461 is coupled in parallel to the station 4. As yet another example, the shunt inductor 900 is coupled at a point between the input 520 of the low frequency circuit 506 and one of the ends 814A through 814D illustrated in FIG. 8B. As another example, the shunt inductor 900 is coupled at a point between the low frequency circuit 506 and one of the ends 814A through 814D. As yet another example, the various manners in which the shunt inductor 900 is coupled to one of the stations 1 through 4 as described with reference to FIGS. 9A through 9C are illustrations of a parallel coupling between the shunt inductor 900 and the one of the stations 1 through 4.

Figure 10:
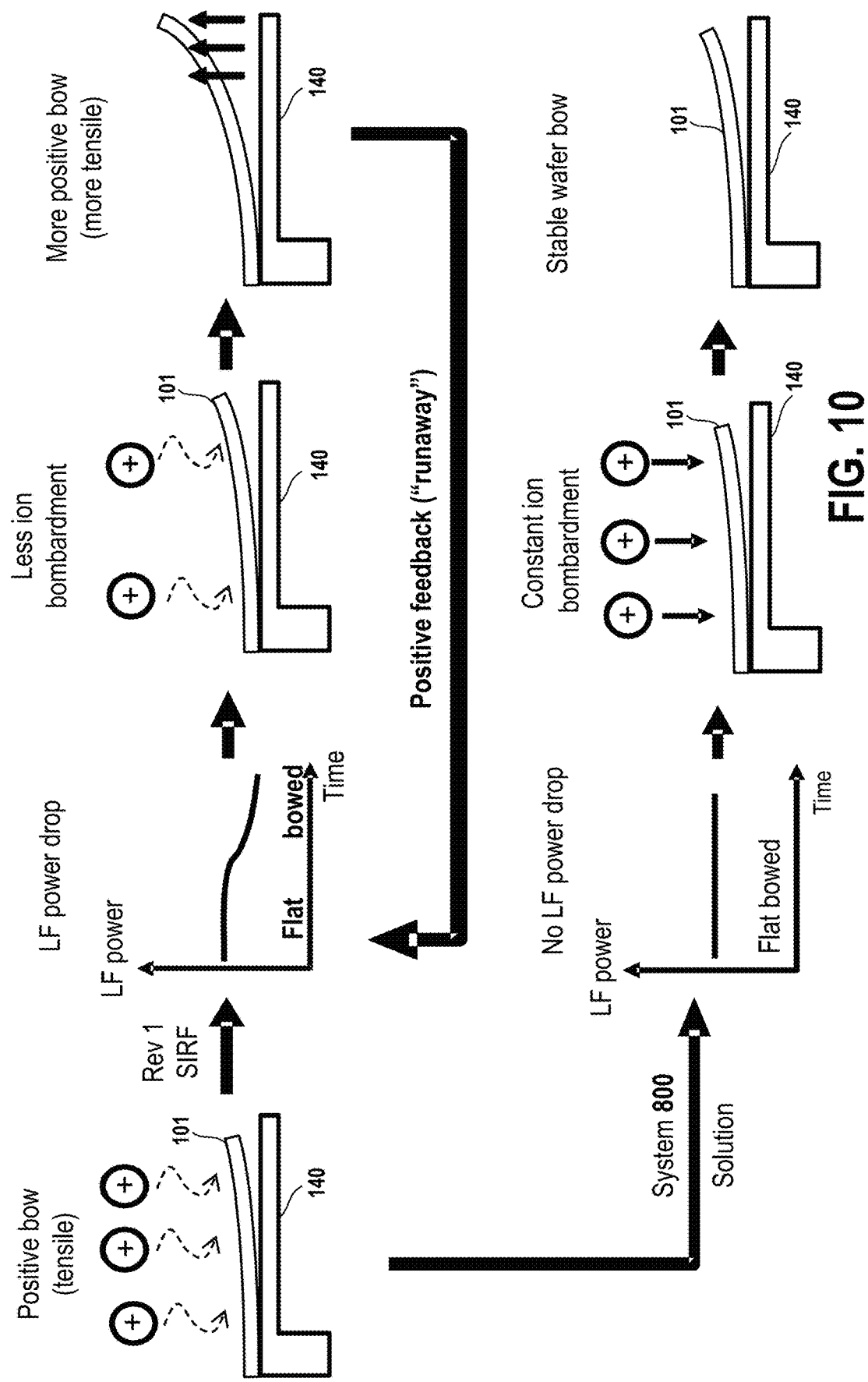
FIG. 10 is a diagram illustrating a comparison of wafer bows when shunt inductors are not used and when the shunt inductors are used.

FIG. 10 is a diagram illustrating a comparison of wafer bows when the shunt inductors L40, L42, L44, and L46 are not used and when the shunt inductors L40, L42, L44, and L46 are used. As shown in the top half of the FIG. 10, when the shunt inductors L40, L42, L44, and L46 are not used, there is a positive bow due to a higher amount of ions bombarding the wafer 101. With an increase in a number of layers deposited on the wafer 101 with time, there is a decrease in low frequency power, shown as a graph in the top half of FIG. 10, that is delivered to the station 1 in which the wafer 101 is being processed. With the decrease in the low frequency power, there is a decrease in a number of the ions, e.g., shown as "less ion bombardment", etc., bombarding the wafer 101 and an increase in wafer bow, e.g., shown as "more positive bow", etc.

Referring to the bottom half of FIG. 10, when the shunt inductors L40, L42, L44, and L46 are used in the system 800, low frequency power delivered remains substantially constant as shown in the graph in the bottom half of FIG. 10. When the low frequency power delivered remains substantially constant, there is substantially constant ion bombardment on the wafer 101. With the passage of time, although there is an increase in the number of layers deposited on the wafer 101, there is minimal change, e.g., no change, etc., in the wafer bow, shown as "stable wafer bow" in the bottom half of FIG. 10.

Figure 11:
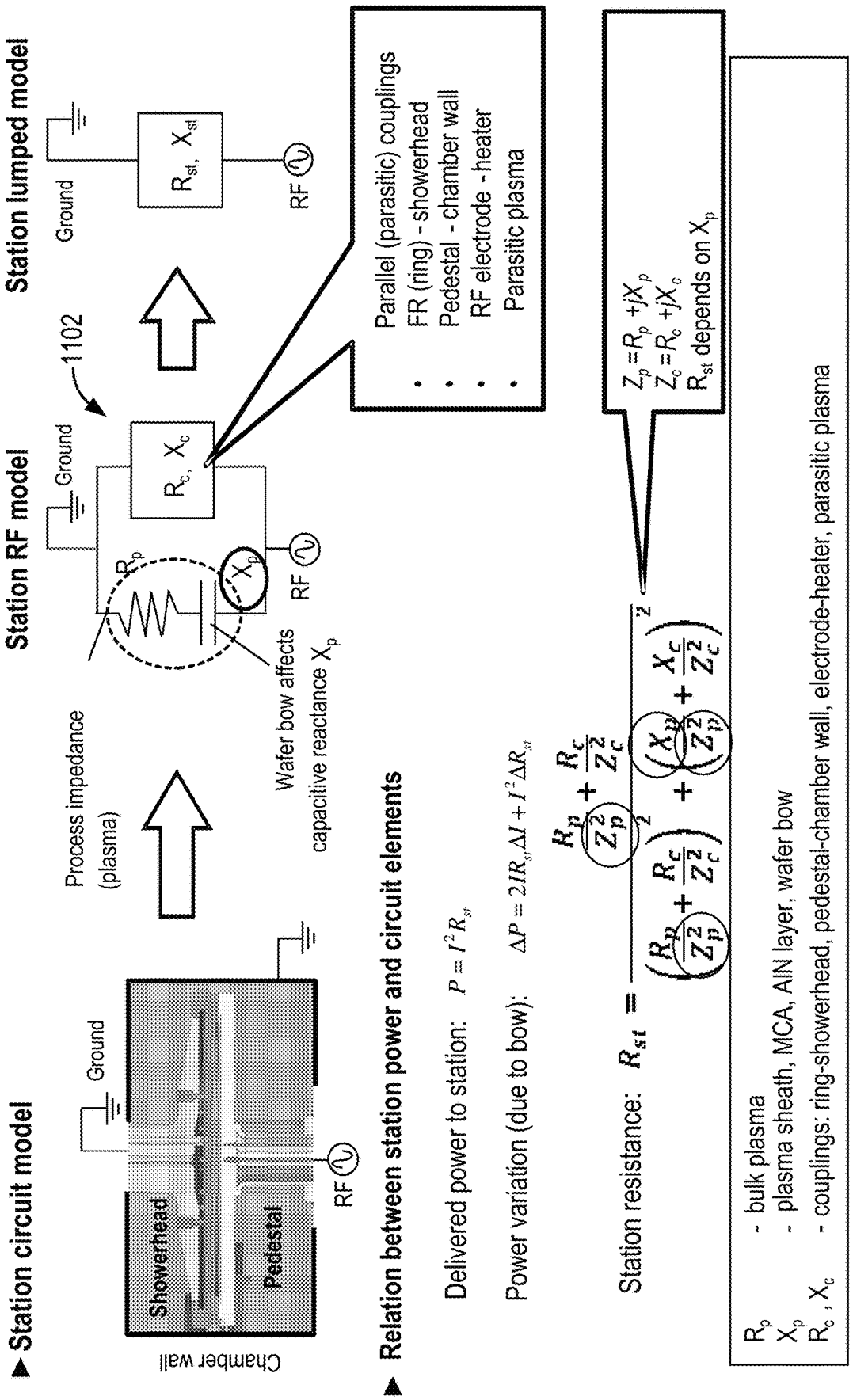
FIG. 11 is a diagram to illustrate an effect of the shunt inductors on a change in low frequency power that is delivered to the four processing stations.

FIG. 11 is a diagram to illustrate an effect of the shunt inductors L40, L42, L44, and L46 on a change in low frequency power that is delivered to the stations 1 through 4. As shown in a circuit 1102, resistance of plasma within one of the stations 1 through 4 is designated as $R_p$, and capacitive reactance of the plasma is designated as $X_p$, which becomes more negative when the wafer 101 bows. Resistance attributed to one of the stations 1 through 4 is $R_{st}$ and reactance attributed to one of the stations 1 through 4 is $X_{st}$. The resistance $R_{st}$ decreases when the wafer 101 bows. A current I is provided to one of the stations 1 through 4 and remains substantially the same when the wafer 101 bows. When the wafer bows, power P delivered to one of the stations 1 through 4 decreases with the decrease in the resistance $R_{st}$. A resistance $R_c$ that affects the resistance $R_{st}$ includes a resistance of the showerhead 150, a resistance of a wall of one of the stations 1 through 4, a resistance of the pedestal 140, and a resistance of parasitic plasma within the one of the stations 1 through 4. A reactance $X_c$ that affects the reactance $X_p$ includes a reactance of the showerhead 150, a reactance of the wall of one of the stations 1 through 4, a reactance of the pedestal 140, and a reactance of parasitic plasma within the one of the stations 1 through 4. The shunt inductors L40, L42, L44, and L46 are used to control, such as increase, the current I that is provided to one of the stations 1 through 4 to further control power that is provided, such as delivered or supplied, to the one of the stations 1 through 4. For example, an inductance of the shunt inductor L40 is modified to achieve a change in the current, e.g., ΔI, etc., supplied to the station 1 to further negate a reduction in power, e.g., ΔP, etc., delivered to the station 1. As another example, a change ΔP in power delivered to the station 1 is zero when ΔI/I is equal to −ΔR/2R. By selecting a value of the shunt inductor L40, ΔI/I is equal to −ΔR/2R. A relative change ΔI/I in the current I is half of a relative change ΔR/R in the resistance R and has an opposite sign as that the relative change in the resistance. With the value of the shunt inductor L40 selected such that ΔI/I is equal to −ΔR/2R, the wafer bow of the wafer 101 at the station 1 does not affect power delivered to the station 1. The power delivered to the station 1 reduces with an increase in the number of layers deposited on the wafer 101.

FIGS. 12A and 12B are diagrams of embodiments of flowcharts to illustrate an effect of user of the shunt inductors L40, L42, L44, and L46 on the reduction in power delivered to the stations 1 through 4. Inductances of the shunt inductors L40, L42, L44, and L46 are controlled, e.g., pre-defined, pre-set, dynamically controlled, etc., to increase the current, e.g., make ΔI positive, etc., that is supplied to the stations 1 through 4. The increase in the current counteracts the reduction in power delivered to the stations 1 through 4. The reduction in the power delivered occurs with the increase in the number of layers deposited on the wafer 101.

The shunt inductor L40 mitigates resistance drop, e.g., mitigates ΔR<<0, etc., of a resistance of the station 1 and also increases current to the station 1 so that ΔI>0. It should be noted that ΔR is the same as $ΔR_{st}$. Two power-affecting mechanisms, e.g., $I^2ΔR$ and 2IRΔI, etc., cancel each other such that a change in power, represented as ΔP, delivered to the station 1 is substantially negligible, such as equal to zero percent or within the pre-determined limit from zero percent. To illustrate, a value of ΔP ranges between 0.05% and 1%. As another illustration, a value of ΔP is 0.7%. The pre-determined limit is stored in the memory device. Similarly, the shunt inductor L42 mitigates resistance drop, e.g., mitigates ΔR<<0, etc., of a resistance of the station 2 and also increases current to the station 2. The shunt inductor L44 mitigates resistance drop, e.g., mitigates ΔR<<0, etc., of a resistance of the station 3 and also increases current to the station 3. The shunt inductor L46 mitigates resistance drop, e.g., mitigates ΔR<<0, etc., of a resistance of the station 4 and also increases current to the station 4.

Figure 13B:
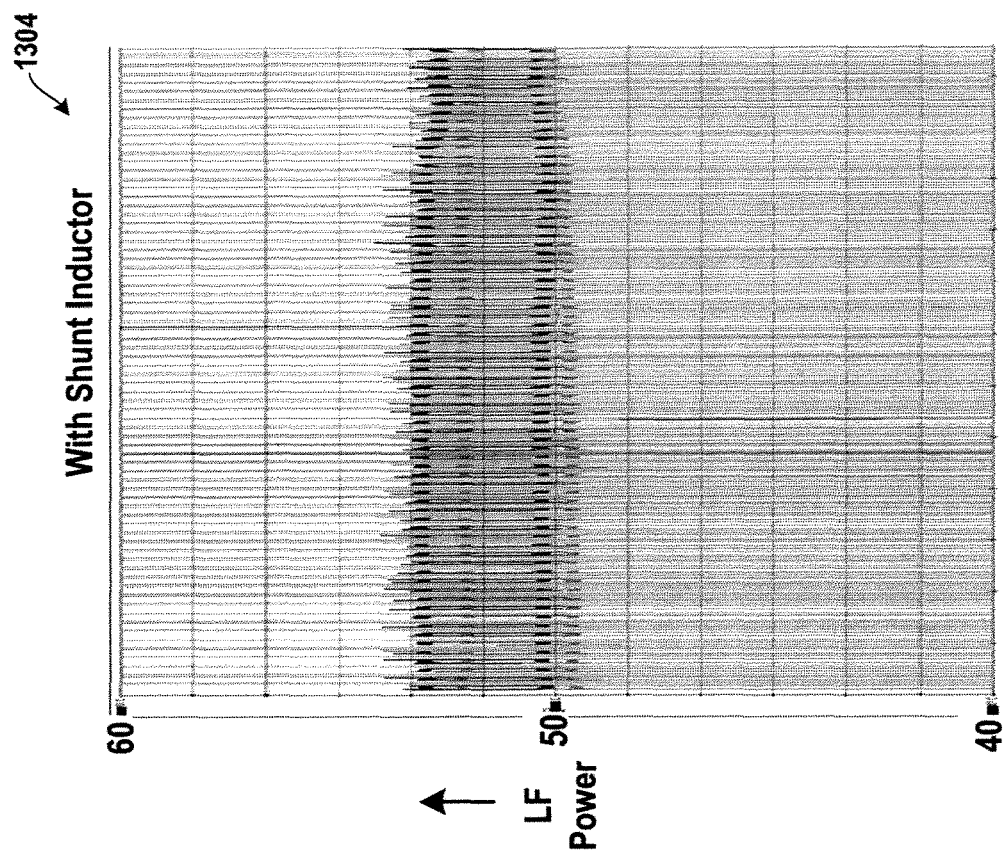
FIG. 13B is a diagram of an embodiment of a graph to illustrate that power delivered to one of the processing stations decreases less compared to the decrease illustrated in FIG. 13A with an increase in the number of layers deposited on the wafer being processed in the processing station.
Figure 13A:
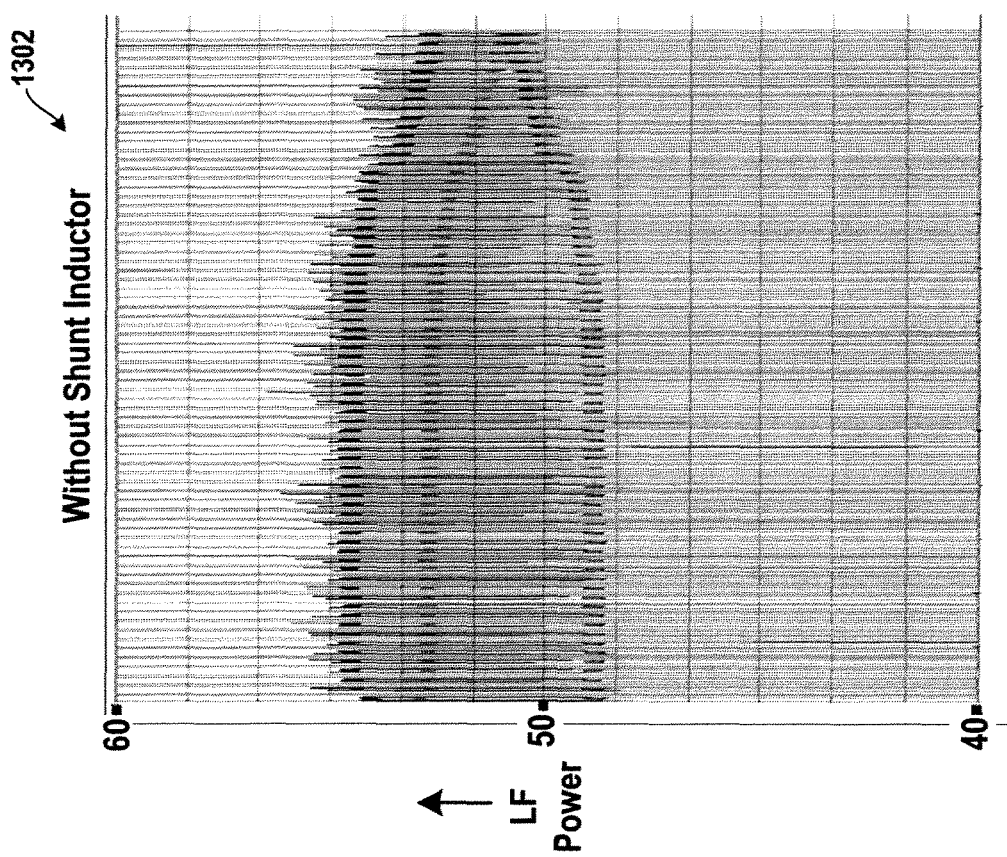
FIG. 13A is a diagram of an embodiment of a graph to illustrate that power delivered to one of the processing stations decreases with an increase in a number of layers deposited on a wafer being processed in the processing station.

FIG. 13A is a diagram of an embodiment of a graph 1302 to illustrate that low frequency power delivered to one of the stations 1 decreases with an increase in the number of layers deposited on the wafer 101. The graph 1302 plots low frequency power versus time. With an increase in time, the number of layers deposited on the wafer 101 increases. Station LF power on a multi-station tool, e.g., all the stations 1 through 4, etc., drifts after some threshold number of stack layers deposited on the wafer 101. The shunt inductors L40, L42, L44, and L46 stabilize power delivery as illustrated below in FIG. 13B.

FIG. 13B is a diagram of an embodiment of a graph 1304 to illustrate that power delivered to the station 1 decreases less compared to the decrease illustrated in FIG. 13A with an increase in the number of layers deposited on the wafer 101. The graph 1304 plots low frequency power delivered to one of the stations 1 through 4 versus time when the shunt inductor L40 is used for the one of the stations 1 through 4.

Each layer, e.g., oxide or nitride, etc., deposited is represented by a narrow power spike in the graph 1304 compared to the graph 1302. A maximum magnitude of each spike represents power delivered to one of the stations 1 through 4.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining operational parameters for carrying out a particular process on or for a semiconductor wafer or to a system. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, a capacitively coupled plasma reactor, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A power distributor for delivering power to a plurality of plasma processing stations, comprising:
   a low frequency circuit coupled to a low frequency impedance matching network and configured to provide a plurality of low frequency radio frequency (RF) signals, wherein the low frequency circuit includes a plurality of high frequency blocking circuits, wherein each of the plurality of high frequency blocking circuits includes an inductor coupled in parallel with a capacitor;
   a high frequency circuit coupled to a high frequency impedance matching network and configured to provide a plurality of high frequency RF signals, wherein the high frequency circuit is coupled to the low frequency circuit;
   an output circuit coupled to the high frequency circuit and the plurality of plasma processing stations, wherein the output circuit is configured to combine the plurality of low frequency RF signals and the plurality of high frequency RF signals to provide a plurality of combined RF signals to the plurality of plasma processing stations; and
   a plurality of shunt inductors, wherein each of the plurality of shunt inductors is coupled to a ground connection at one end and to a corresponding one of the plurality of high frequency blocking circuits at an opposite end to control an amount of current to a corresponding one of the plurality of plasma processing stations, wherein each of the plurality of shunt inductors is coupled in parallel to a corresponding one of a plurality of capacitors.

2. The power distributor of claim 1, wherein one of the plurality of shunt inductors is coupled between an input of the low frequency circuit and an end of a coaxial cable that couples an output of the output circuit to the corresponding one of the plurality of plasma processing stations.

3. The power distributor of claim 1, wherein one of the plurality of shunt inductors is coupled via one of the plurality of high frequency blocking circuits and a switch to a balancing inductor of the output circuit.

4. The power distributor of claim 3, wherein the corresponding one of the plurality of capacitors is coupled to the ground connection at one end and to the corresponding one of the plurality of high frequency blocking circuits at an opposite end.

5. The power distributor of claim 1, wherein each of the plurality of shunt inductors is a variable inductor or a fixed inductor.

6. A power distributor, for delivering power to a plurality of plasma processing stations, comprising:
   a low frequency circuit coupled to a low frequency impedance matching network and configured to provide a plurality of low frequency radio frequency (RF) signals, wherein the low frequency circuit includes a plurality of direct current (DC) blocking capacitors;
   a high frequency circuit coupled to a high frequency impedance matching network and configured to provide a plurality of high frequency RF signals, wherein the high frequency circuit is coupled to the low frequency circuit;
   an output circuit coupled to the high frequency circuit and the plurality of plasma processing stations, wherein the output circuit is configured to combine the plurality of low frequency RF signals and the plurality of high frequency RF signals to provide a plurality of combined RF signals to the plurality of plasma processing stations; and
   a plurality of shunt inductors, wherein each of the plurality of shunt inductors is coupled at a point between an input of the low frequency circuit and a corresponding one of the plurality of DC blocking capacitors of the low frequency circuit to control an amount of current to a corresponding one of the plurality of plasma processing stations.

7. The power distributor of claim 6, wherein each of the plurality of shunt inductors is a variable inductor or a fixed inductor.

8. The power distributor of claim 6, wherein one of the plurality of shunt inductors is coupled between an input of the low frequency circuit and an end of a coaxial cable that couples an output of the output circuit to the corresponding one of the plurality of plasma processing stations.

9. A power distributor for delivering power to a plurality of plasma processing stations, comprising:
   a low frequency circuit coupled to a low frequency impedance matching network and configured to provide a plurality of low frequency radio frequency (RF) signals, wherein the low frequency circuit includes a plurality of direct current (DC) blocking capacitors and a plurality of inductors;
   a high frequency circuit coupled to a high frequency impedance matching network and configured to provide a plurality of high frequency RF signals, wherein the high frequency circuit is coupled to the low frequency circuit;
   an output circuit coupled to the high frequency circuit and the plurality of plasma processing stations, wherein the output circuit is configured to combine the plurality of low frequency RF signals and the plurality of high frequency RF signals to provide a plurality of combined RF signals to the plurality of plasma processing stations; and
   a plurality of shunt inductors, wherein each of the plurality of shunt inductors is coupled at a point between a corresponding one of the plurality of DC blocking capacitors of the low frequency circuit and a corresponding one of the plurality of inductors of the low frequency circuit to control an amount of current to a corresponding one of the plurality of plasma processing stations.

10. The power distributor of claim 9, wherein one of the plurality of shunt inductors is coupled between an input of the low frequency circuit and an end of a coaxial cable that couples an output of the output circuit to the corresponding one of the plurality of plasma processing stations.

11. The power distributor of claim 9, wherein each of the plurality of shunt inductors is a variable inductor or a fixed inductor.

12. A system for delivering power to a plurality of plasma processing stations, comprising:
   a first radio frequency (RF) generator configured to generate a first RF signal having a first frequency;
   a second RF generator configured to generate a second RF signal having a second frequency;
   a first matching network coupled to the first RF generator to receive the first RF signal, wherein the first matching network is configured to output a first modified RF signal upon receiving the first RF signal from the first RF generator;
   a second matching network coupled to the second RF generator to receive the second RF signal, wherein the second matching network is configured to output a second modified RF signal upon receiving the second RF signal from the second RF generator;

a power distributor coupled to an output of the first matching network and an output of the second matching network, wherein the power distributor is configured to combine the first modified RF signal and the second modified RF signal to provide a plurality of combined RF signals to the plurality of plasma processing stations, wherein the power distributor has multiple outputs coupled to the plurality of plasma processing stations, wherein the power distributor includes:

a low frequency circuit coupled to the first matching network and configured to receive the first modified RF signal to provide a plurality of low frequency RF signals, wherein the low frequency circuit includes a plurality of high frequency blocking circuits, wherein each of the plurality of high frequency blocking circuits includes an inductor coupled in parallel with a capacitor;

a high frequency circuit coupled to the second matching network and to the low frequency circuit and configured to receive the second modified RF signal to provide a plurality of high frequency RF signals; and an output circuit coupled to the high frequency circuit and the plurality of plasma processing stations, wherein the output circuit is configured to combine the plurality of low frequency RF signals and the plurality of high frequency RF signals to provide the plurality of combined RF signals to the plurality of plasma processing stations; and a plurality of shunt inductors, wherein each of the plurality of shunt inductors is coupled to a ground connection at one end and to a corresponding one of the plurality of high frequency blocking circuits at an opposite end to control an amount of current to a corresponding one of the plurality of plasma processing stations, wherein each of the plurality of shunt inductors is coupled in parallel to a corresponding one of a plurality of capacitors.

13. The system of claim 12, wherein one of the plurality of shunt inductors is coupled between an input of the low frequency circuit and an end of a coaxial cable that couples an output of the output circuit to the corresponding one of the plurality of plasma processing stations.

14. The system of claim 12, wherein one of the plurality of shunt inductors is coupled via one of the plurality of high frequency blocking circuits and a switch to a balancing inductor of the output circuit.

15. The system of claim 14, wherein the corresponding one of the plurality of capacitors is coupled to the ground connection at one end and to the corresponding one of the plurality of high frequency blocking circuits at an opposite end.

16. The system of claim 12, wherein each of the plurality of shunt inductors is a variable inductor or a fixed inductor.

* * * * *

UNITED STATES PATENT AND TRADEMARK OFFICE
CERTIFICATE OF CORRECTION

PATENT NO. : 10,553,465 B2
APPLICATION NO. : 15/640053
DATED : February 4, 2020
INVENTOR(S) : Edward Augustyniak et al.

It is certified that error appears in the above-identified patent and that said Letters Patent is hereby corrected as shown below:

On the Title Page

Item (54) and in the Specification, Title, Column 1, Lines 1-2:
"CONTROL OF WATER BOW IN MULTIPLE STATIONS" should read -- CONTROL OF WAFER BOW IN MULTIPLE STATIONS --

Signed and Sealed this
Twenty-fourth Day of March, 2020

Andrei Iancu
*Director of the United States Patent and Trademark Office*